US008196543B2

(12) United States Patent
Nakajima et al.

(10) Patent No.: US 8,196,543 B2
(45) Date of Patent: Jun. 12, 2012

(54) DEFECT REPAIRING APPARATUS, DEFECT REPAIRING METHOD, PROGRAM, AND COMPUTER-READABLE RECORDING MEDIUM

(75) Inventors: Yoshinori Nakajima, Nara (JP); Hirotsugu Matoba, Sakurai (JP); Toshihiro Tamura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 708 days.

(21) Appl. No.: 12/226,500

(22) PCT Filed: Apr. 18, 2007

(86) PCT No.: PCT/JP2007/058412
§ 371 (c)(1),
(2), (4) Date: Jan. 13, 2009

(87) PCT Pub. No.: WO2007/123148
PCT Pub. Date: Nov. 1, 2007

(65) Prior Publication Data
US 2009/0304916 A1   Dec. 10, 2009

(30) Foreign Application Priority Data
Apr. 21, 2006   (JP) .................................. 2006-118510

(51) Int. Cl.
*B05C 5/02*   (2006.01)
(52) U.S. Cl. ............. 118/300; 118/323; 347/19; 347/37
(58) Field of Classification Search .................. 118/300, 118/323; 347/19, 37; 358/504, 505
See application file for complete search history.

(56) References Cited

U.S. PATENT DOCUMENTS

| 5,830,297 | A |  | 11/1998 | Nakahira et al. |
| 5,938,871 | A |  | 8/1999 | Nakahira et al. |
| 6,270,187 | B1 | * | 8/2001 | Murcia et al. .................... 347/43 |
| 2003/0190419 | A1 | * | 10/2003 | Katagami et al. ............. 427/240 |
| 2006/0050106 | A1 | * | 3/2006 | Kojima ............................ 347/37 |

FOREIGN PATENT DOCUMENTS

| CN | 1513605 A | 7/2004 |
| EP | 1972385 A1 | 9/2008 |
| EP | 2014373 A1 | 1/2009 |
| EP | 2014374 A1 | 1/2009 |
| JP | 2001-347208 | 12/2001 |
| JP | 2002-346452 A | 12/2002 |
| JP | 2003-066218 A | 3/2003 |
| JP | 2003-191462 A | 7/2003 |

(Continued)

*Primary Examiner* — Laura Edwards
(74) *Attorney, Agent, or Firm* — David G. Conlin; Steven J. Jensen; Edwards Wildman Palmer LLP

(57) ABSTRACT

A defect repairing apparatus (1) capable of efficiently repairing defects includes: a substrate-mounting plate (3) for securing a substrate conveyed; a plurality of droplet discharge units (11) disposed along a direction different from the direction of conveyance of the substrate as seen from a direction perpendicular to the substrate secured by the substrate-mounting plate (3), which discharge droplets onto defects scattered about on the substrate; a head gantry unit (7) on which the plurality of droplet discharge units (11) have been mounted; and a gantry sliding mechanism (4) for moving the head gantry unit (7) relatively at a constant velocity along the direction of conveyance of the substrate, the droplet discharge units (11) moving each independently along a direction different from the direction of conveyance in accordance with data indicative of the positions of the defects scattered about on the substrate, while the head gantry unit (7) is moving along the direction of conveyance of the substrate.

10 Claims, 22 Drawing Sheets

FOREIGN PATENT DOCUMENTS

| | | |
|---|---|---|
| JP | 2004-070073 | 3/2004 |
| JP | 2004-337707 | 12/2004 |
| JP | 2005-181472 A | 7/2005 |
| JP | 2005-185978 | 7/2005 |
| JP | 2006-011244 | 1/2006 |
| JP | 2006-043682 | 2/2006 |
| JP | 2006-205005 A | 8/2006 |
| JP | 2006-239560 A | 9/2006 |

* cited by examiner

FIG.4
(a)
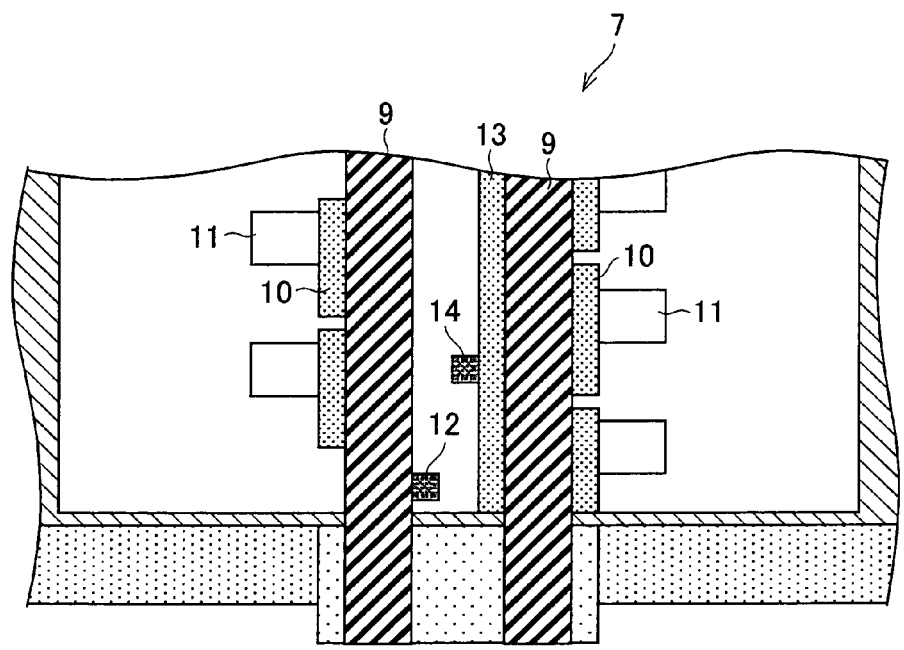
(b)
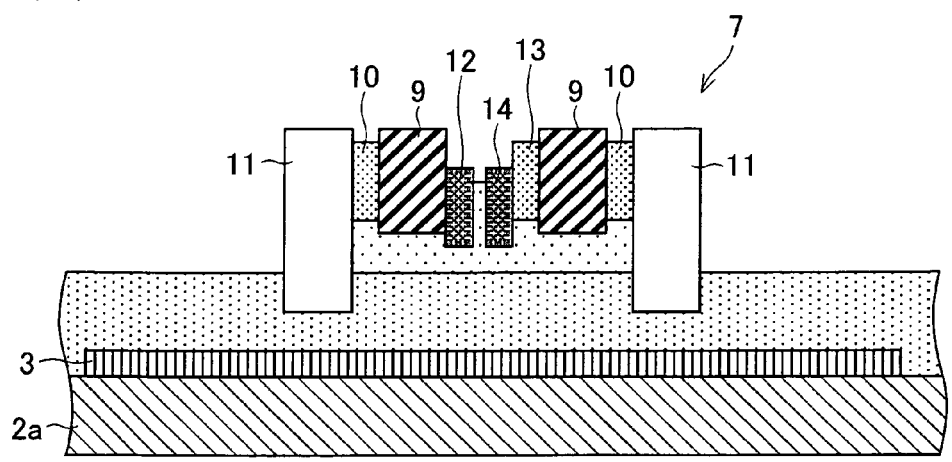

FIG.7
(a)
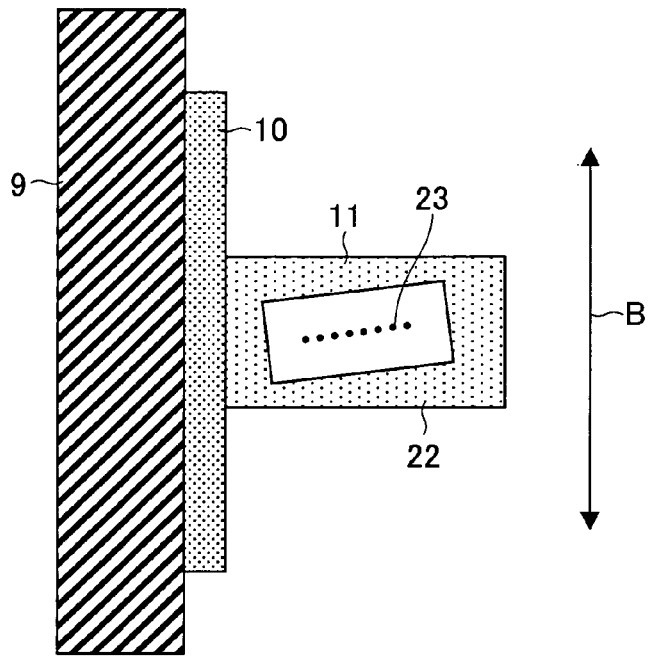
(b)
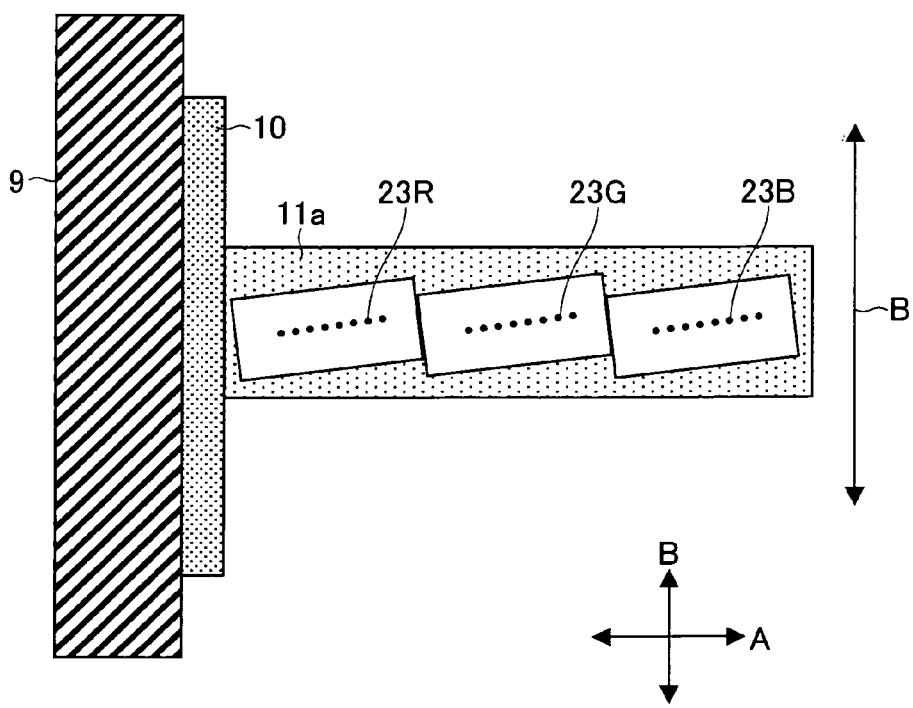

FIG.9
(a)
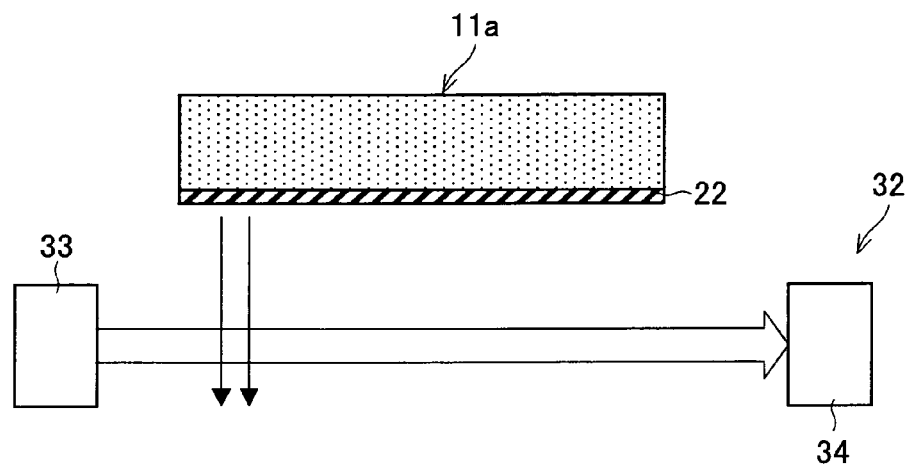
(b)
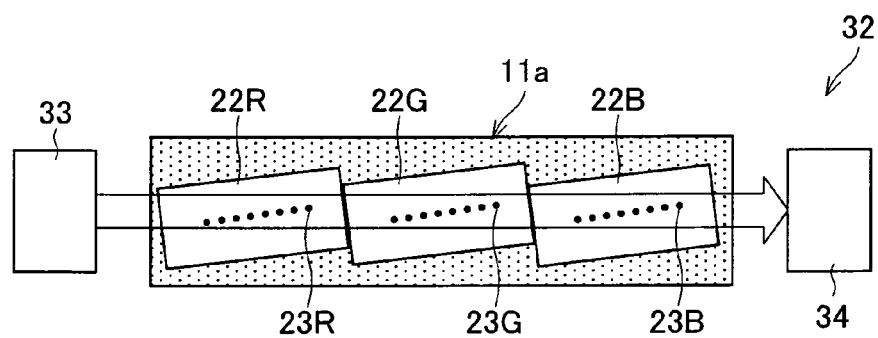

FIG.10
(a)
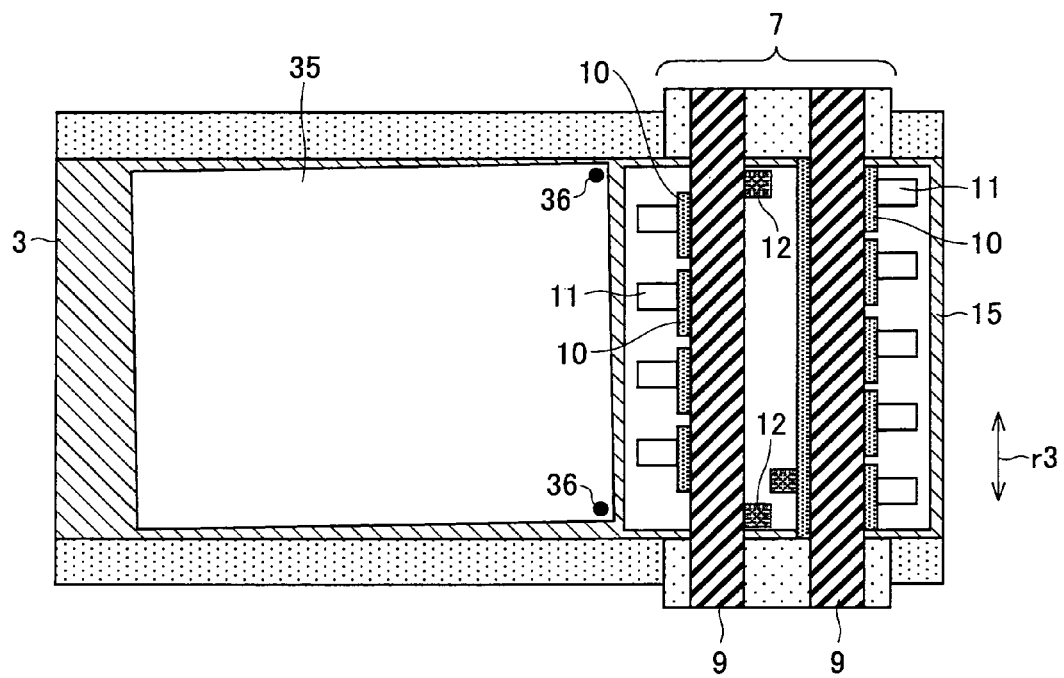
(b)
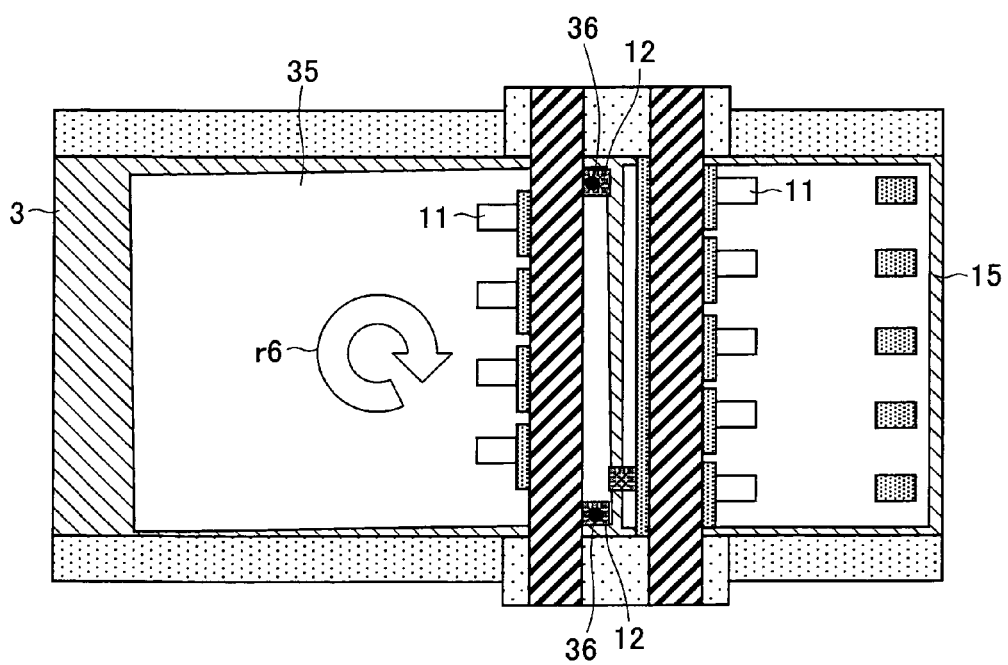

FIG.11
(a)
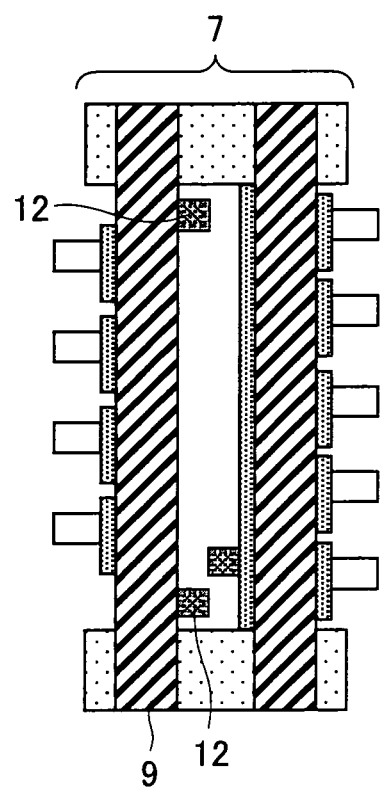
(b)
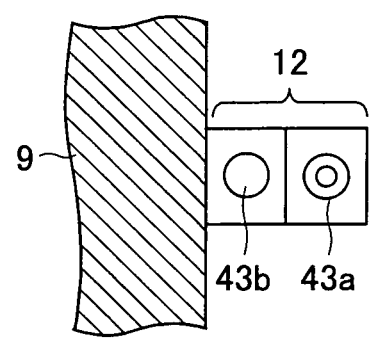

FIG.12
(a)
RIGHT FILED OF VIEW L
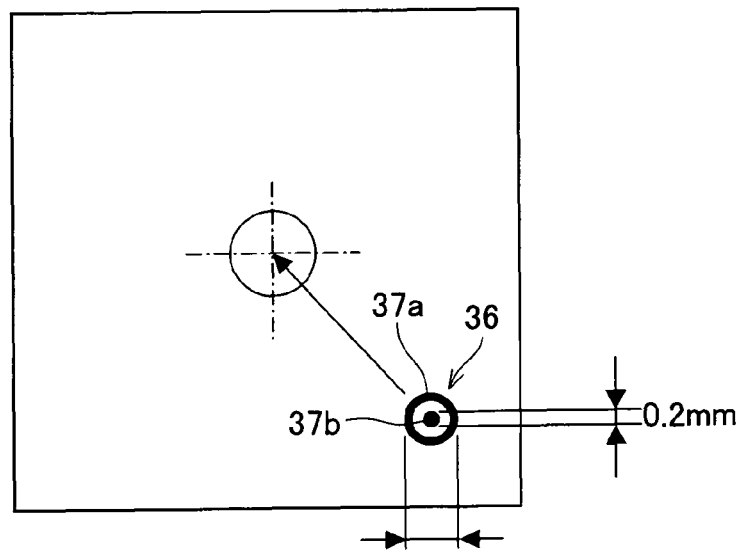
(b)
LEFT FILED OF VIEW L
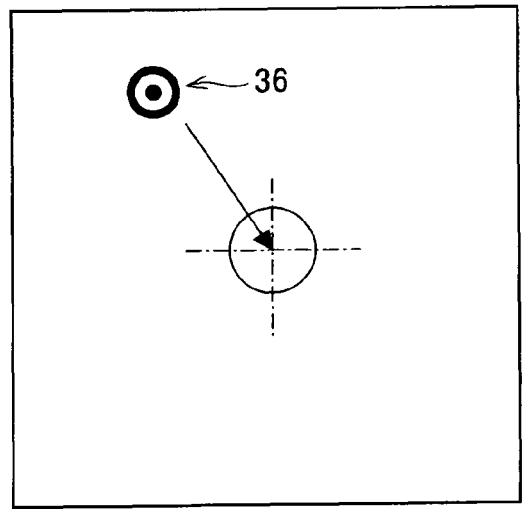

FIG.13
(a)
RIGHT FILED OF VIEW H
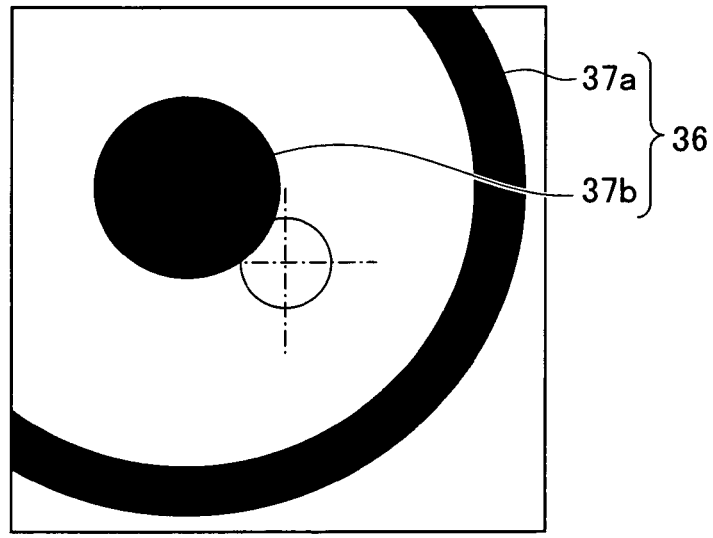
(b)
LEFT FILED OF VIEW H
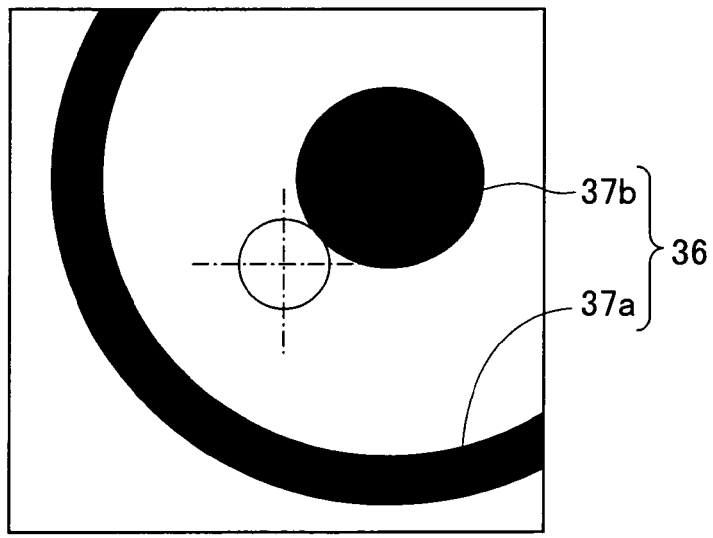

FIG.15
(a)
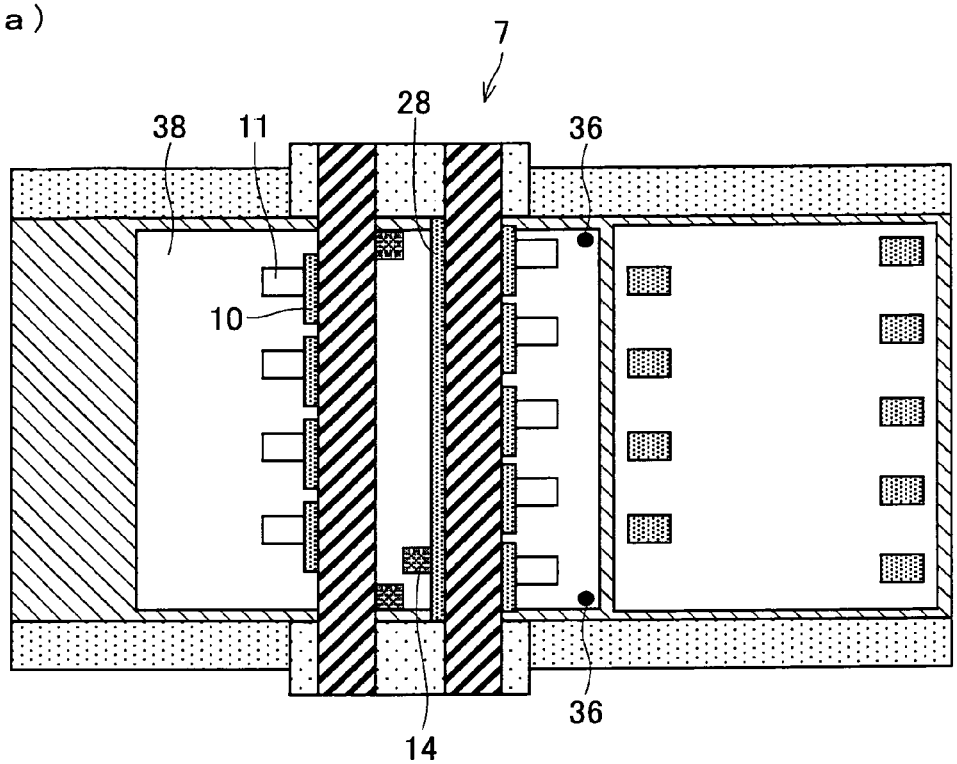
(b)
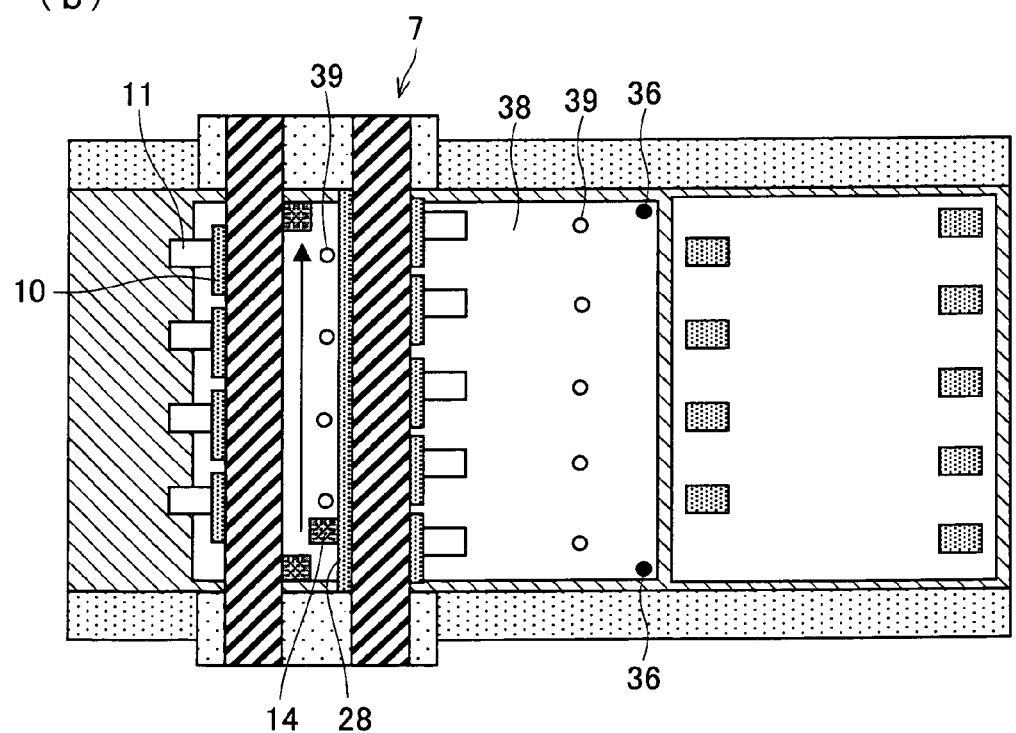

FIG.16
(a)
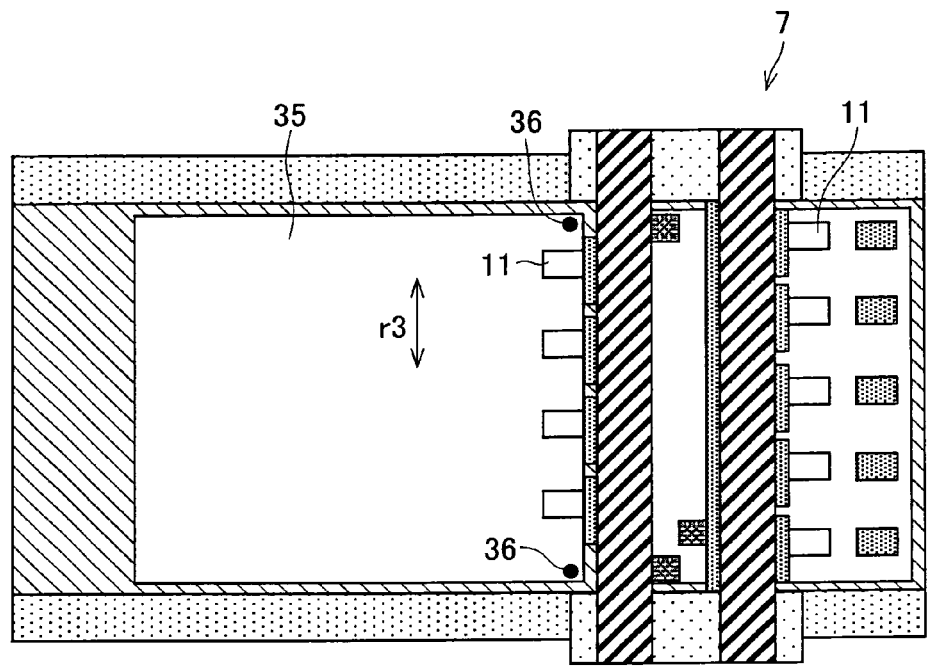
(b)
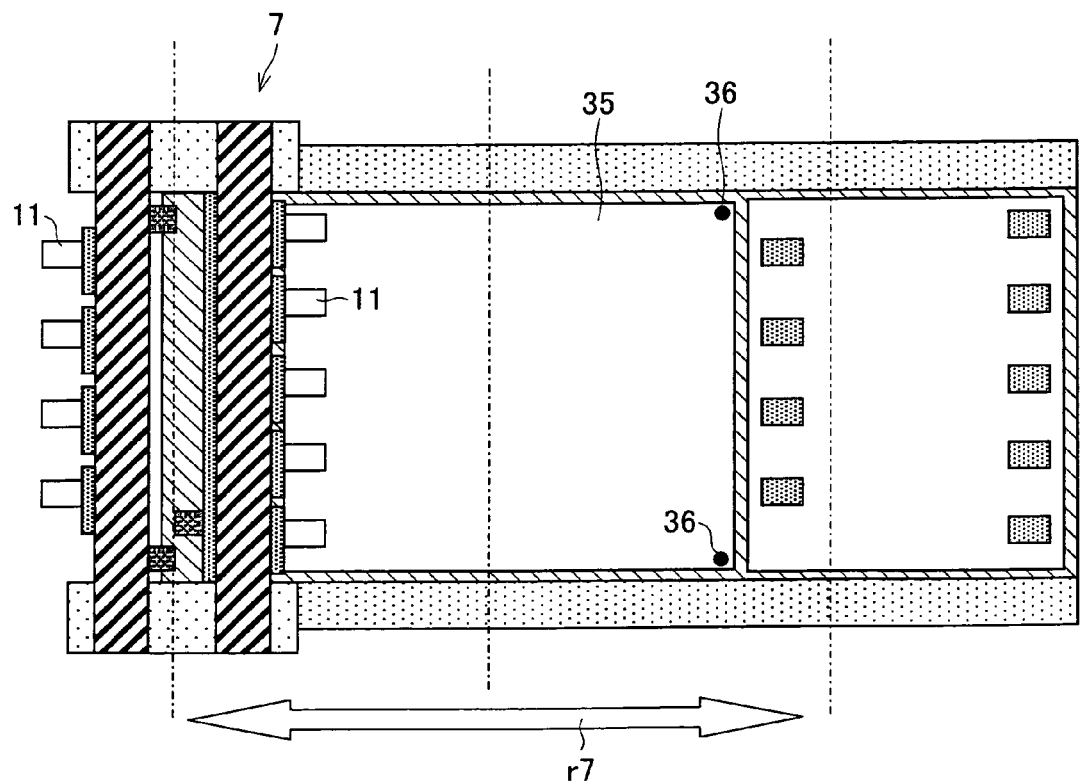

FIG.17
(a)
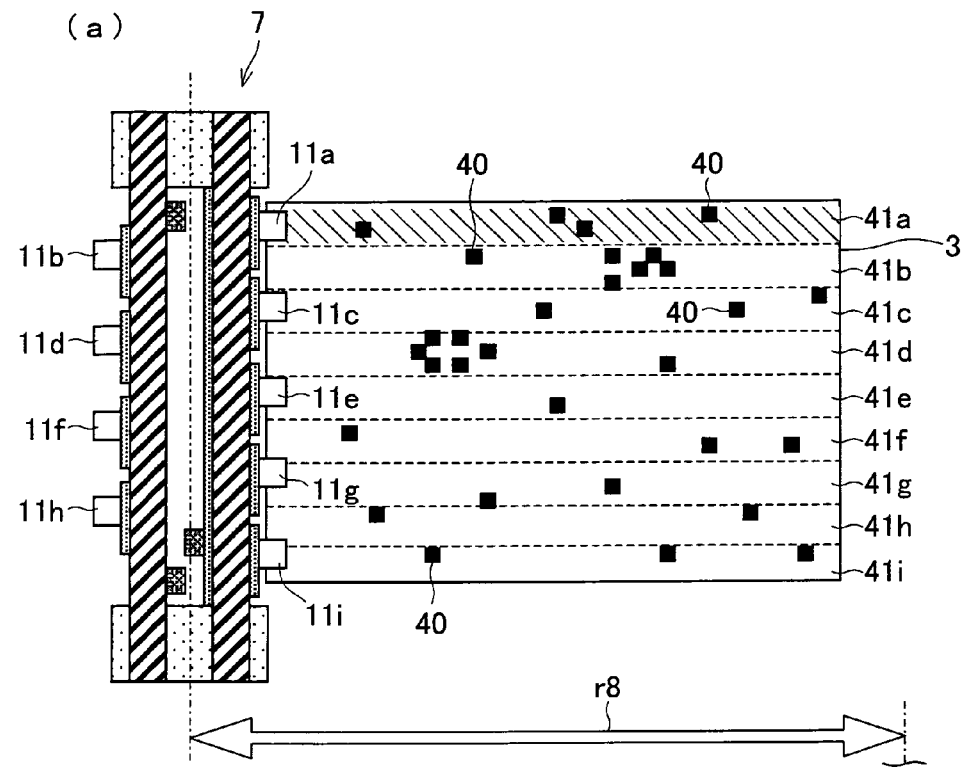
(b)
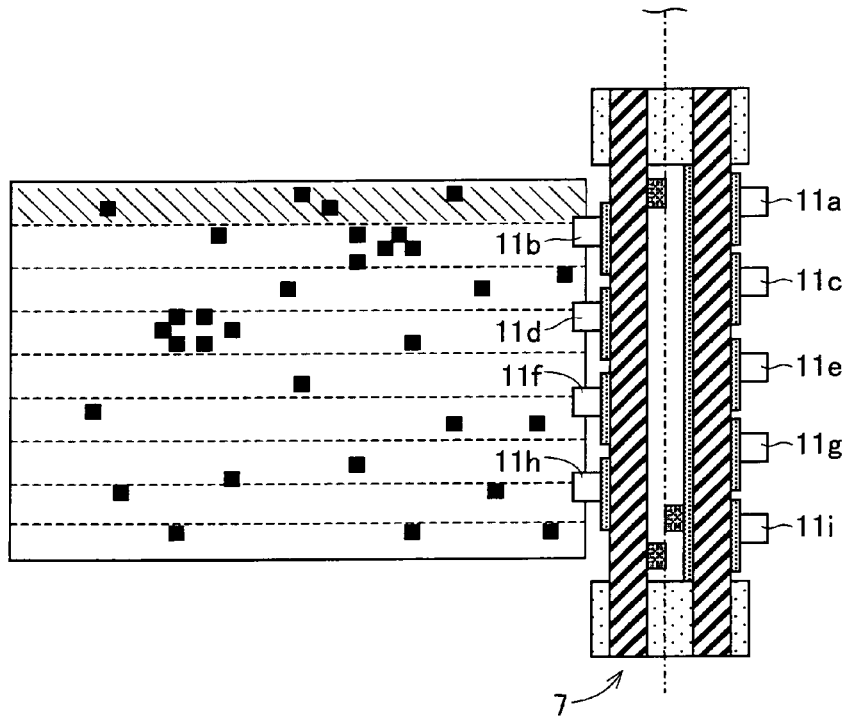

FIG.18
(a)
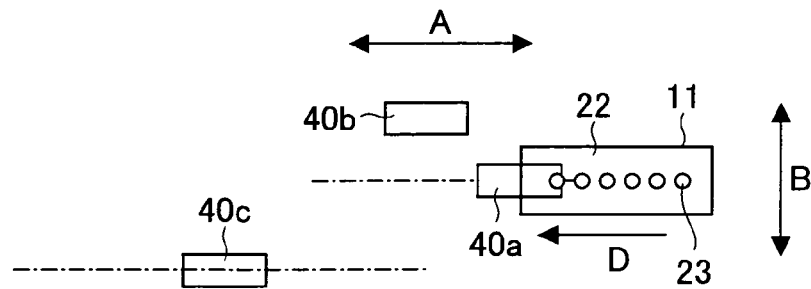
(b)
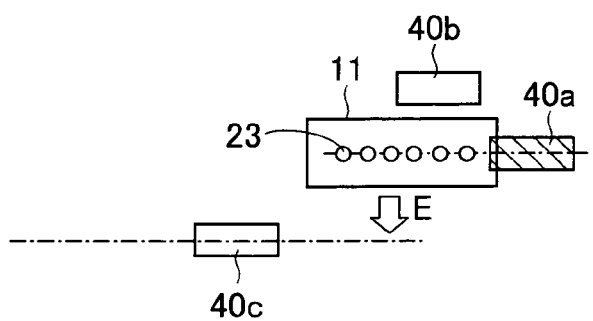
(c)
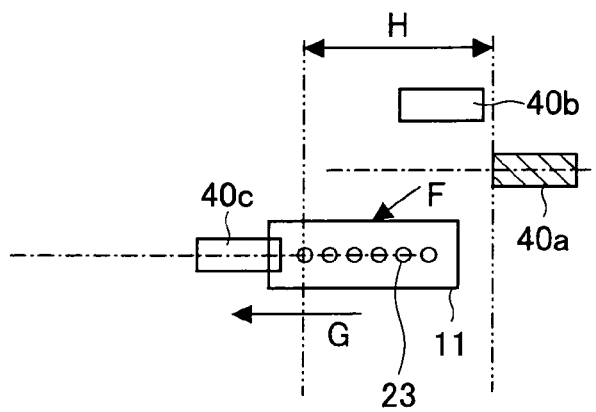
(d)
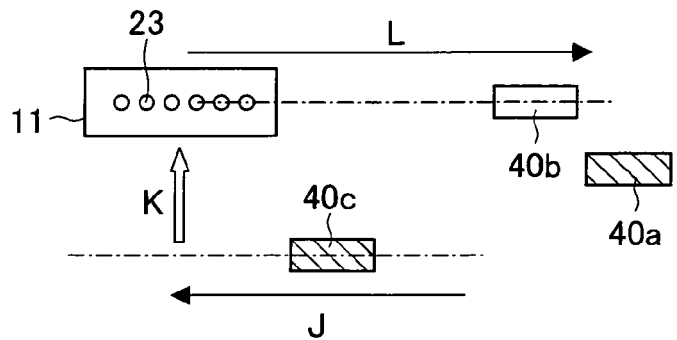

FIG.19
(a)
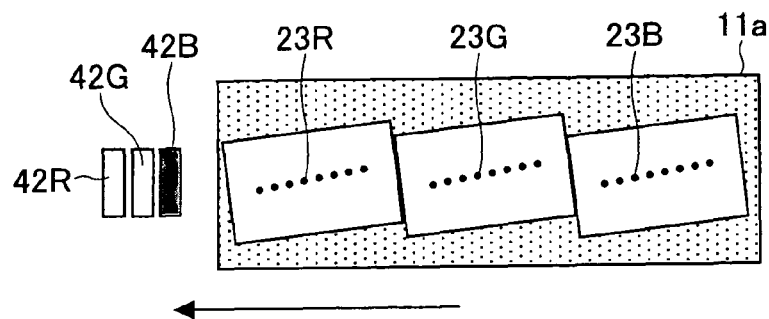
(b)
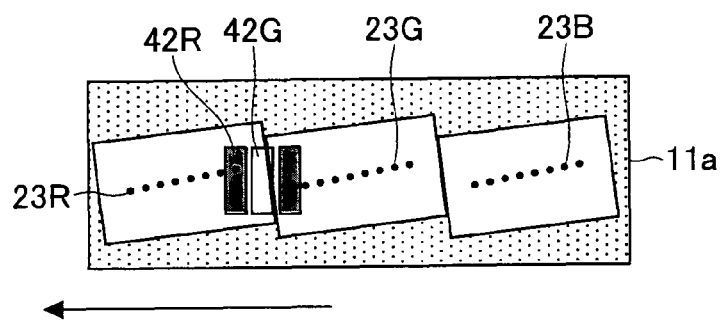
(c)
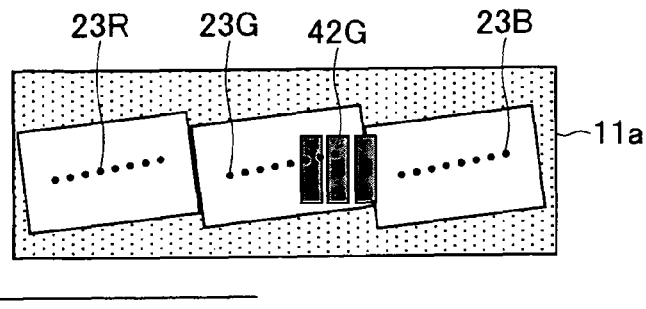

FIG.20
(a)
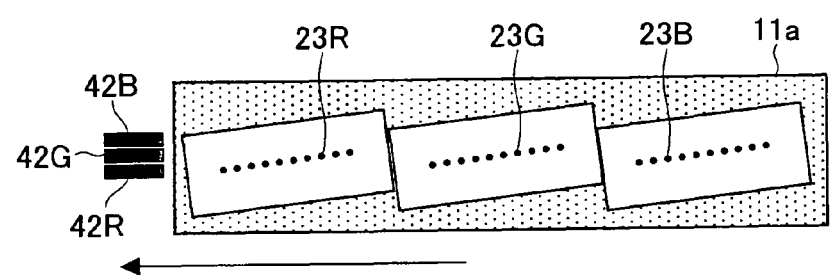
(b)
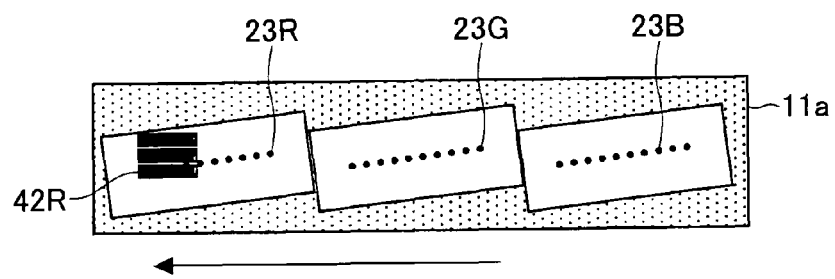
(c)
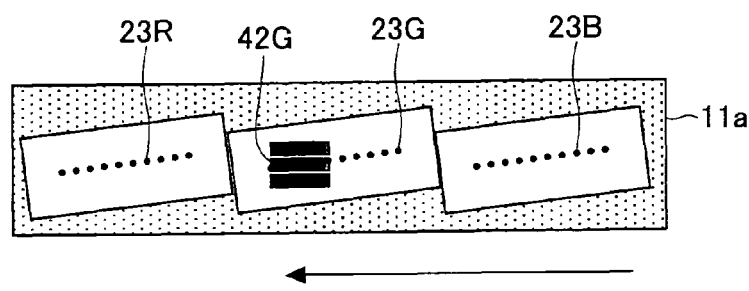

FIG.21
(a)
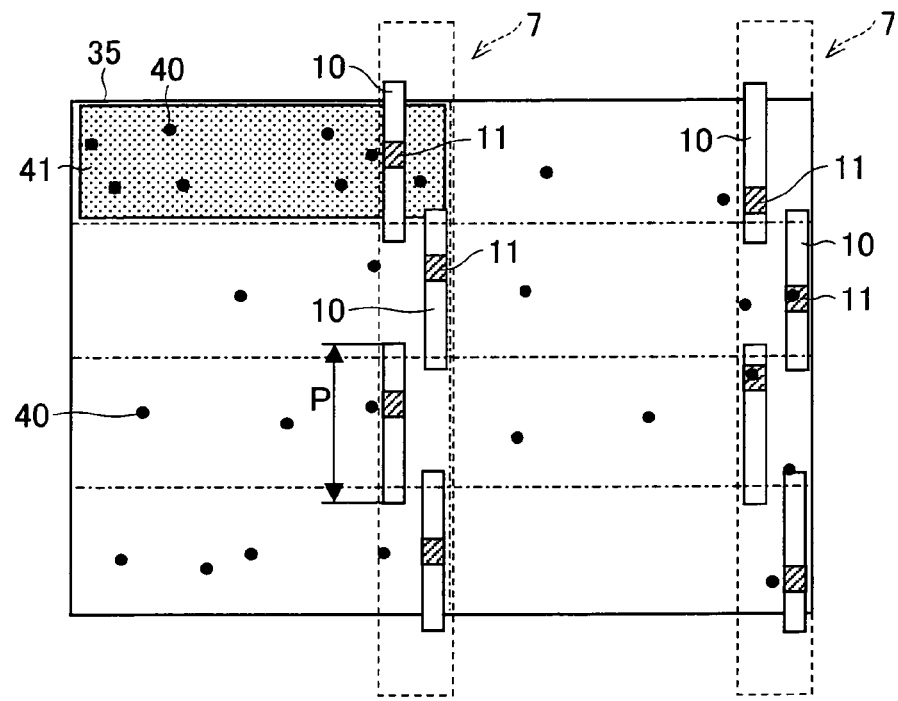
(b)
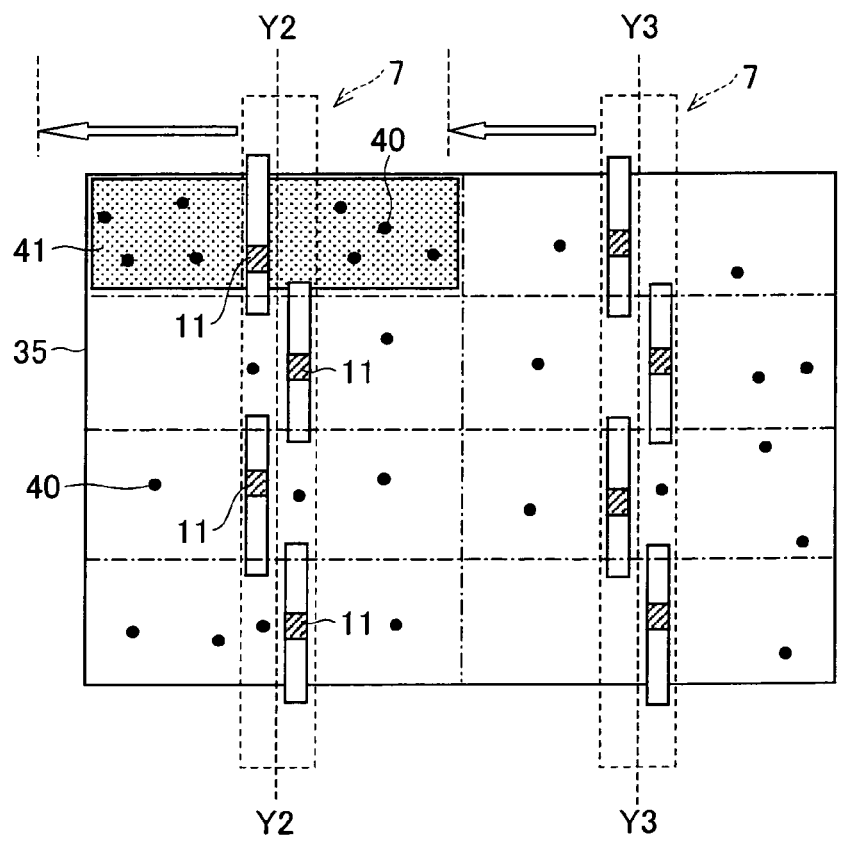

FIG.23
(a)
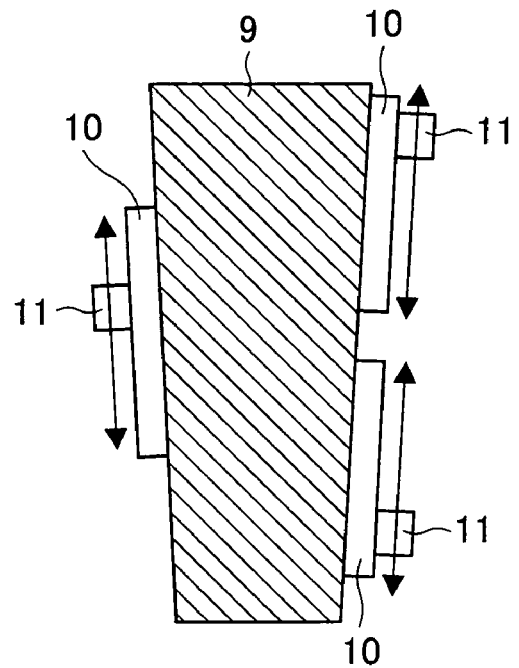
(b)
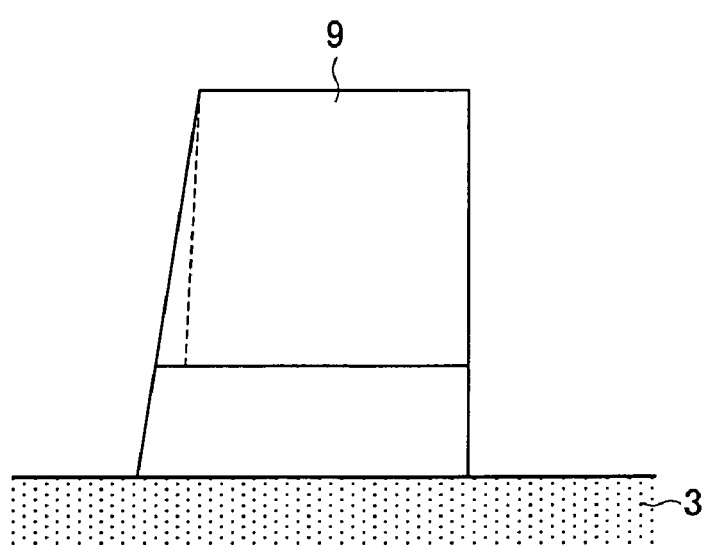

DEFECT REPAIRING APPARATUS, DEFECT REPAIRING METHOD, PROGRAM, AND COMPUTER-READABLE RECORDING MEDIUM

TECHNICAL FIELD

The present invention relates to a defect repairing apparatus, a defect repairing method, a program, and a computer-readable recording medium for repairing defects in accordance with data indicative of the positions of defects scattered about on a substrate.

BACKGROUND ART

In recent years, an ink-jet technology is expected to be applied to a manufacturing apparatus as well as a printer apparatus for forming an image on a paper medium. For example, Patent Document 1 discloses, as an apparatus for manufacturing a liquid crystal display, an organic EL display, a plasma display, an electron-releasing element, an electrophoretic display device, or the like, a manufacturing apparatus equipped with an ink-jet droplet discharge element. In order to improve the accuracy of position with which droplets land on a substrate, Patent Document 1 uses a substratum of the apparatus as a stationary stone platen having a stage provided directly thereon so as to convey substrates in one direction and a carriage mechanism provided directly thereon so as to move an ink-jet head in a direction orthogonal to the direction of movement of the stage.

Usually, a general-purpose ink-jet printer forms an image with use of a single ink-jet head unit having several ink-jet head elements mounted for each color so as to serve as elements for discharging droplets. Each of the ink-jet head elements has a width of ½ to 2 inches, and has nozzle holes arrayed at regular intervals of 150 to 300 nozzles per inch. As for a method for forming an image, an image has been formed on a recording paper sheet by passing the ink-jet head unit more than once in a direction orthogonal to the direction of conveyance of the recording paper sheet while feeding the recording paper sheet by a paper-feeding roller.

Even in cases where such an ink-jet system is applied to a manufacturing apparatus, the manufacturing apparatus is identical in ink-head element to the general-purpose printer. Therefore, it is still the case that the column-wise size of nozzles is at most approximately 1 to 2 inches.

Meanwhile, a process for manufacturing a liquid crystal display, an organic EL display, a plasma display, an electron-releasing element, or an electrophoretic display device tends to make an attempt to bring down costs and shorten takt time by increasing yields with use of a large-area substrate. Manufacture of such devices according to the ink-jet system has required a manufacturing apparatus capable of processing a large-area substrate whose sides extend as long as several meters.

An example of an ink-jet manufacturing apparatus capable of processing a large-area substrate at a high speed is a line-head manufacturing apparatus in which a plurality of ink-jet head elements are arrayed in a line not shorter than the size of a substrate. Under such a line-head system, ink-jet elements each having a width of at most 1 to 2 inches are arrayed in a zigzag pattern so as to reach in length the size of a substrate. Assuming that the size of a substrate is several meters, it is necessary to array at least 100 to 200 heads. Such a line-head manufacturing apparatus can be said to be very effective for a substrate, such as a color filter substrate, which requires droplets to be discharged all over the substrate and which is regular in spot onto which droplets are discharged.

Further, as a part of a method for manufacturing a color filter substrate, an arrangement is known which, in cases where a color filter substrate has portions defective in coloration, discharges color filter material only to the defective portions (Patent Document 2).

Further disclosed is an arrangement, provided with a linear fixed head and a repair head, which detects a non-discharging nozzle from the linear fixed head, moves the repair head to a position corresponding to the non-discharging nozzle, discharges droplets through the repair head instead of the non-discharging nozzle (Patent Document 3).

Further disclosed is an arrangement, provided with a first discharge section, a second discharge section, and a drawing inspection section for detecting a defect in a pattern drawn by the first discharge section, which moves the second discharge section relatively to a position corresponding to the defect and discharges droplets in accordance with information from the drawing inspection section (Patent Document 4).

Patent Document 1: Japanese Unexamined Patent Application Publication No. 191462/2003 (Tokukai 2003-191462; published on Jul. 8, 2003)

Patent Document 2: Japanese Unexamined Patent Application Publication No. 66218/2003 (Tokukai 2003-66218; published on Mar. 5, 2003)

Patent Document 3: Japanese Unexamined Patent Application Publication No. 185978/2005 (Tokukai 2005-185978; published on Jul. 14, 2005)

Patent Document 4: Japanese Unexamined Patent Application Publication No. 337707/2004 (Tokukai 2004-337707; published on Dec. 2, 2004)

DISCLOSURE OF THE INVENTION

However, an attempt to repair the color filter substrate of Patent Document 2 by the line-head system of Patent Document 1 is met with the following problems.

Using the line-head system as means for repairing defects (defective spots) scattered about on the color filter substrate not only requires the same amount of processing time as discharging droplets all over the substrate, but also is likely to clog nozzles by causing most of the nozzles to be non-operating nozzles that do not discharge droplets. Further, all the nozzles require maintenance, which causes an increase in unnecessary waste liquid. Furthermore, the line-head system is very inefficient in equalizing the amount of discharge among the nozzles, because the line-head system makes it necessary to correct the amount of discharge from each of a total of several thousand nozzles only to discharge droplets onto the intended spots scattered about.

Further, the system, applied often to general-purpose printers, in which an array of ink-jet head units on one gantry is moved back and forth not only causes an increase in scanning distance for the ink-head units, but also is limited in scanning speed in terms of operational stability, thus making it impossible to shorten processing time.

In various fields of manufacturing as well as repair of color filters, there will be a demand for efficiently discharging droplets onto an intended spot as well as all over a large-area substrate.

The discharge of droplets onto a substrate by the combined arrangement of the linear fixed head and the repair head of Patent Document 3 or the combined arrangement of the first discharge section and the second discharge section of Patent Document 4 undesirably causes an increase in takt time in comparison with a repairing arrangement provided with a separate apparatus specialized in repair.

The present invention has been made in view of the foregoing problems, and it is an object of the present invention to provide a defect repairing apparatus, a defect repairing method, a program, and a computer-readable recording medium each capable of efficiently repairing defects scattered about on a substrate.

In order to solve the foregoing problems, a defect repairing apparatus according to the present invention includes: securing means for securing a substrate conveyed; a plurality of droplet discharge units, disposed along a direction different from a direction of conveyance of the substrate as seen from a direction perpendicular to the substrate secured by the securing means, which discharge droplets onto defects scattered about on the substrate; one or more gantries on which the plurality of droplet discharge units have been mounted; and moving means for moving the one or more gantries relatively at a constant velocity along the direction of conveyance of the substrate, the droplet discharge units moving each independently along a direction different from the direction of conveyance in accordance with data indicative of positions of the defects scattered about on the substrate, while the one or more gantries are moving relatively along the direction of conveyance of the substrate.

According to this feature, the droplet discharge units move each independently along a direction perpendicular to the direction of conveyance in accordance with data indicative of positions of the defects scattered about on the substrate, while the one or more gantries are moving relatively along the direction of conveyance of the substrate. This makes it possible that defects scattered about on a substrate can be efficiently repaired by carrying in a substrate having defects scattered about on a surface thereof and then moving the droplet discharge units each independently along a direction perpendicular to the direction of conveyance while moving the one or more gantries relatively along the direction of conveyance of the substrate. Further, even if the weight of a gantry is increased in accordance with a large substrate having defects scattered about on a surface thereof, there will not be deterioration in accuracy with which droplets discharged by droplet discharge units land on a substrate, because the gantry is moved at a constant velocity.

The defect repairing apparatus according to the present invention is preferably arranged such that the moving means causes the one or more gantries to move back and forth from one side to another of the substrate.

According to the foregoing arrangement, the one or more gantries move with respect to the substrate. This makes it possible to save more space in comparison with an arrangement in which a large substrate moves with respect to a gantry.

The defect repairing apparatus according to the present invention is preferably arranged such that the gantries are provided with a predetermined distance therebetween along the direction of conveyance of the substrate.

The foregoing arrangement makes it possible to reduce the total amount of movement per gantry for repairing a plurality of defects, thereby making it possible to shorten time for processing of a substrate (takt time).

The defect repairing apparatus according to the present invention is preferably arranged such that the one or more gantries are provided with a plurality of sliding mechanisms that cause the respective droplet discharge units to slide along a direction different from the direction of conveyance. In particular, for the apparatus to save space, it is desirable that the plurality of sliding mechanisms be arrayed in a direction perpendicular to the direction of conveyance.

The foregoing arrangement makes it possible for a simple arrangement to cause the droplet discharge units to move each independently along a direction different from the direction of conveyance.

The defect repairing apparatus according to the present invention is preferably arranged such that the sliding mechanisms cause the respective droplet discharge units to slide in sliding ranges whose edges are overlapped with one another as seen from the direction of conveyance.

The foregoing arrangement makes it possible to repair defects all over a substrate.

The defect repairing apparatus according to the present invention is preferably arranged such that the plurality of sliding mechanisms are disposed in a zigzag pattern as seen from the direction perpendicular to the substrate.

The foregoing arrangement makes it possible to reduce the size of a gantry by efficiently disposing droplet discharge units on the gantry, thereby making it possible to shorten time for processing of a substrate (takt time) by increasing the speed of movement.

The defect repairing apparatus according to the present invention is preferably arranged such that the droplet discharge units are assigned to their respective repair regions of the substrate.

The foregoing arrangement makes it possible to reduce apparatus costs by reducing the amount of movement of each droplet discharge unit. Further, the foregoing arrangement makes it possible to efficiently perform a repairing operation.

The defect repairing apparatus according to the present invention is preferably arranged such that the droplet discharge units discharge the droplets onto the defects in a resting state after having moved along the direction different from the direction of conveyance.

The foregoing arrangement makes it possible to increase the landing accuracy of droplets with respect to defects.

The defect repairing apparatus according to the present invention is preferably arranged such that the droplet discharge units move along the direction different from the direction of conveyance so that the droplet discharge units discharge the droplets in positions identical to positions of the defects on the substrate.

The foregoing arrangement makes it possible to repair a plurality of defects, scattered about on a substrate, by discharging droplets onto the defects through each droplet discharge unit in accordance with data indicative of the positions of the defects.

The defect repairing apparatus according to the present invention is preferably arranged such that each of the gantries on which the plurality of droplet discharge units have been mounted has a weight of not less than 0.5 tons to not more than 4 tons.

According to the foregoing arrangement, even if the weight of a gantry is increased to not less than 0.5 tons to not more than 4 tons as the gantry becomes larger in size in accordance with an increase in size of a screen for use in a liquid crystal display device, there will not be deterioration in accuracy with which droplets discharged by droplet discharge units land on a substrate, because the gantry is moved at a constant velocity.

In order to solve the foregoing problems, a defect repairing method according to the present invention includes the steps of: securing a substrate conveyed; moving one or more gantries relatively at a constant velocity along a direction of conveyance of the substrate, the one or more gantries being provided with a plurality of droplet discharge units disposed along a direction different from the direction of conveyance of the substrate as seen from a direction perpendicular to the substrate secured by the securing means; and discharging droplets onto defects by moving the droplet discharge units each independently along a direction different from the direction of conveyance in accordance with data indicative of positions of the defects, while the one or more gantries are moving along the direction of conveyance of the substrate, the defects being scattered about on the substrate.

According to this feature, the droplet discharge units move each independently along a direction different from the direction of conveyance in accordance with data indicative of positions of the defects scattered about on the substrate, while the one or more gantries are moving relatively along the direction of conveyance of the substrate. This makes it possible that defects scattered about on a substrate can be efficiently repaired by carrying in a substrate having defects scattered about on a surface thereof and then moving the droplet discharge units each independently along a direction different from the direction of conveyance while moving the one or more gantries relatively along the direction of conveyance of the substrate. Further, even if the weight of a gantry is increased in accordance with a large substrate having defects scattered about on a surface thereof, there will not be deterioration in accuracy with which droplets discharged by droplet discharge units land on a substrate, because the gantry is moved at a constant velocity.

In order to solve the foregoing problems, a program according to the present invention causes a computer to perform the steps of: securing a substrate conveyed; moving one or more gantries relatively at a constant velocity along a direction of conveyance of the substrate, the one or more gantries being provided with a plurality of droplet discharge units disposed along a direction different from the direction of conveyance of the substrate as seen from a direction perpendicular to the substrate secured by the securing means; and discharging droplets onto defects by moving the droplet discharge units each independently along a direction different from the direction of conveyance in accordance with data indicative of positions of the defects, while the one or more gantries are moving along the direction of conveyance of the substrate, the defects being scattered about on the substrate.

In order to solve the foregoing problems, a computer-readable recording medium according to the present invention contains a program for causing a computer to perform the steps of: securing a substrate conveyed; moving one or more gantries relatively at a constant velocity along a direction of conveyance of the substrate, the one or more gantries being provided with a plurality of droplet discharge units disposed along a direction different from the direction of conveyance of the substrate as seen from a direction perpendicular to the substrate secured by the securing means; and discharging droplets onto defects by moving the droplet discharge units each independently along a direction different from the direction of conveyance in accordance with data indicative of positions of the defects, while the one or more gantries are moving along the direction of conveyance of the substrate, the defects being scattered about on the substrate.

As described above, the defect repairing apparatus according to the present invention includes moving means for moving the one or more gantries relatively at a constant velocity along the direction of conveyance of the substrate, and the droplet discharge units move each independently along a direction different from the direction of conveyance in accordance with data indicative of the positions of a plurality of defects scattered about on the substrate, while the one or more gantries are moving along the direction of conveyance of the substrate. This brings about an effect of efficiently repairing defects scattered about on a substrate.

As described above, the defect repairing method according to the present invention moves the one or more gantries relatively at a constant velocity along the direction of conveyance of the substrate, and moves the droplet discharge units each independently along a direction different from the direction of conveyance in accordance with data indicative of the positions of a plurality defects scattered about on the substrate, while the one or more gantries are moving along the direction of conveyance of the substrate. This brings about an effect of efficiently repairing defects scattered about on a substrate.

(a) and (b) of FIG. 4 are a plan view and a front view, respectively, of an arrangement of a main part of the head gantry unit of the defect repairing apparatus.

Figure 5:
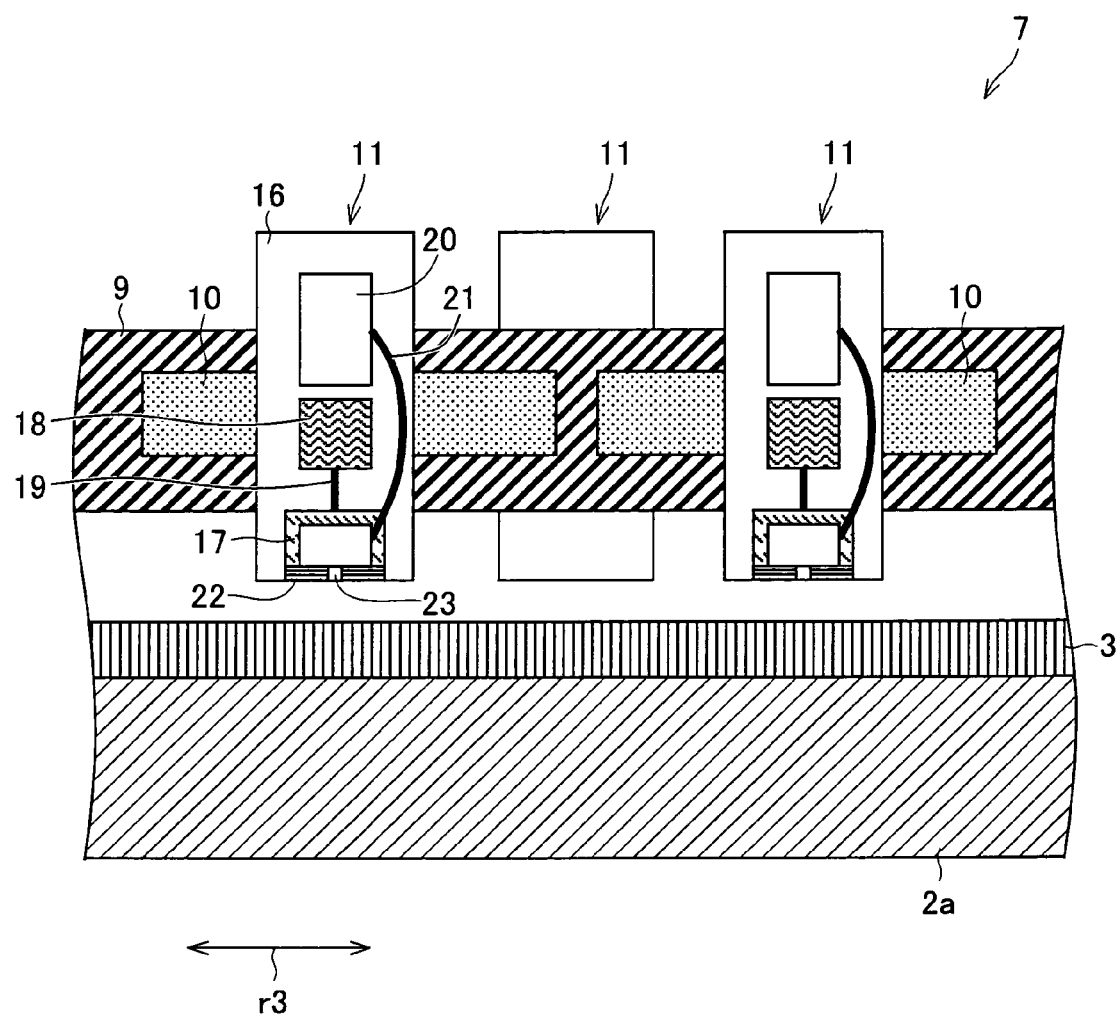

FIG. 5 is a side view of an arrangement of a main part of each droplet discharge unit of the head gantry unit.

Figure 6:
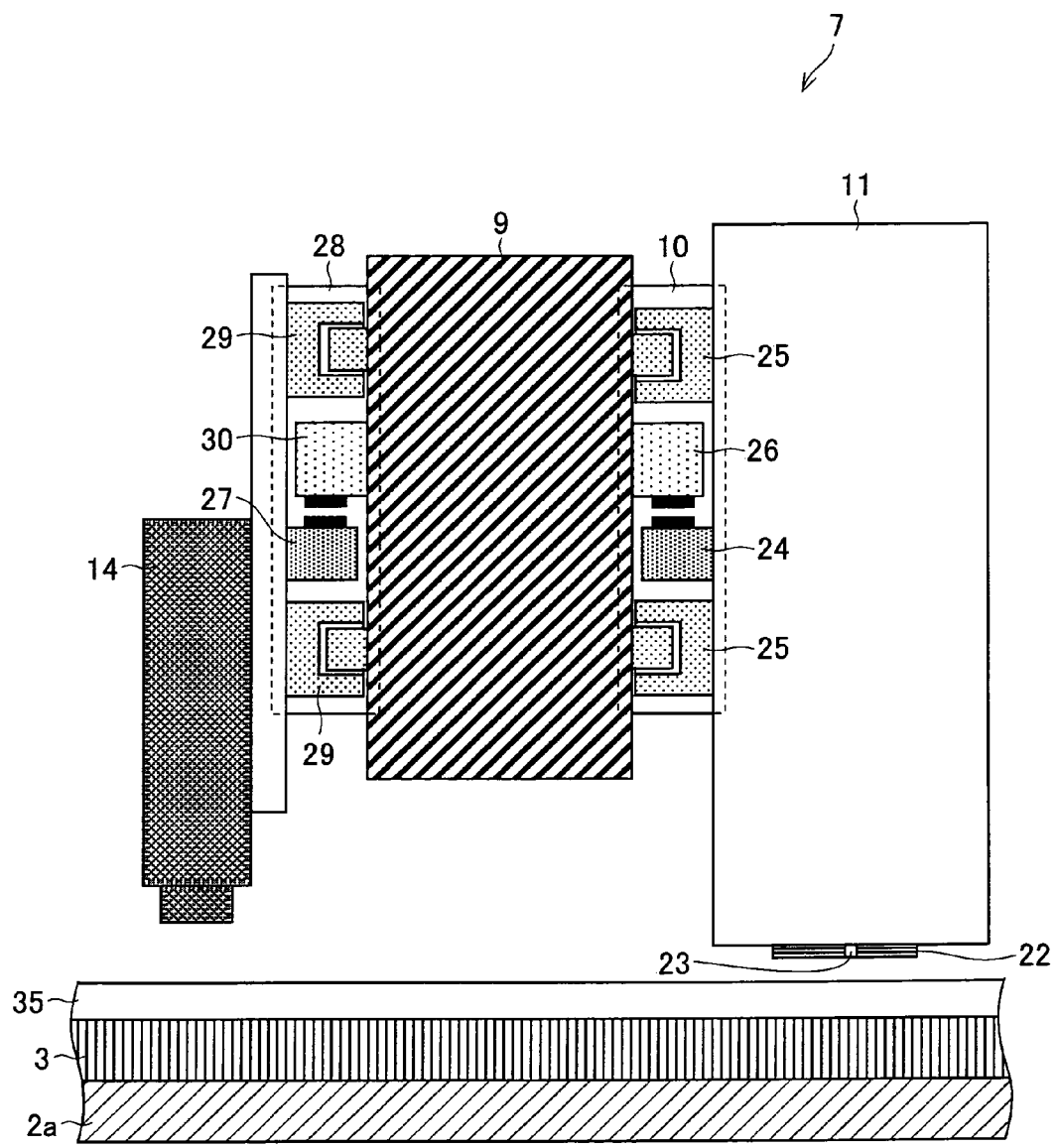

FIG. 6 is a front view of an arrangement of a main part of a discharge-unit sliding mechanism of the head gantry unit.

(a) of FIG. 7 is a bottom view of the arrangement of the main part of the droplet discharge unit, and (b) of FIG. 7 is a bottom view of an arrangement of a main part of another droplet discharge unit.

Figure 8:
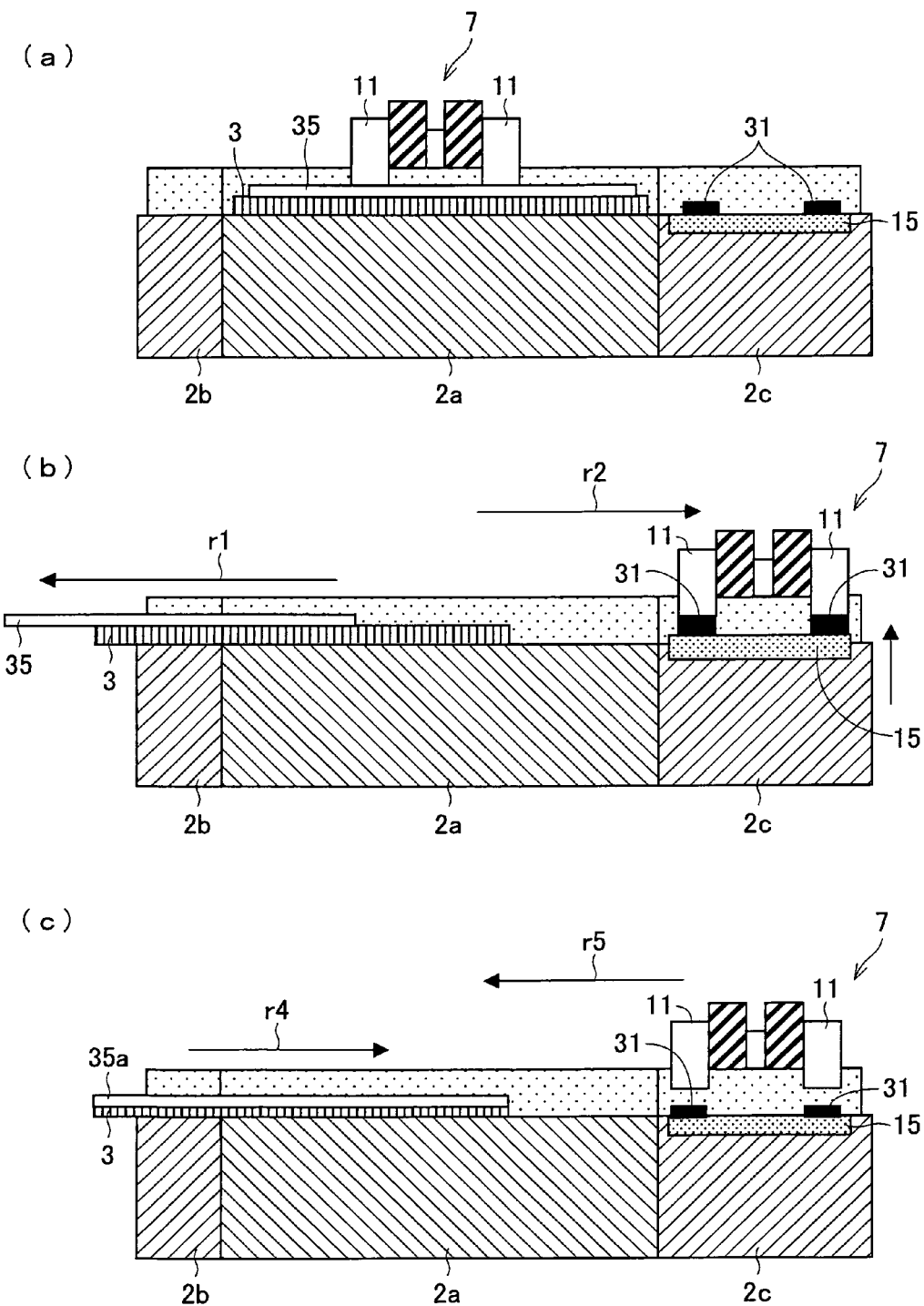

(a) through (c) of FIG. 8 are schematic cross-sectional views for explaining the operation of the head gantry unit and the substrate-mounting plate.

(a) and (b) of FIG. 9 are a front view and a bottom view, respectively, of an arrangement of a non-discharge detector of a maintenance mechanism of the defect repairing apparatus.

(a) and (b) of FIG. 10 are plan views for explaining an alignment operation of the defect repairing apparatus.

(a) and (b) of FIG. 11 are plan views of an arrangement of a main part of each alignment camera of the head gantry unit.

(a) and (b) of FIG. 12 are plan views of main parts for explaining the alignment operation of the defect repairing apparatus.

(a) and (b) of FIG. 13 are enlarged plan views of the main parts for explaining the alignment operation of the defect repairing apparatus.

Figure 14:
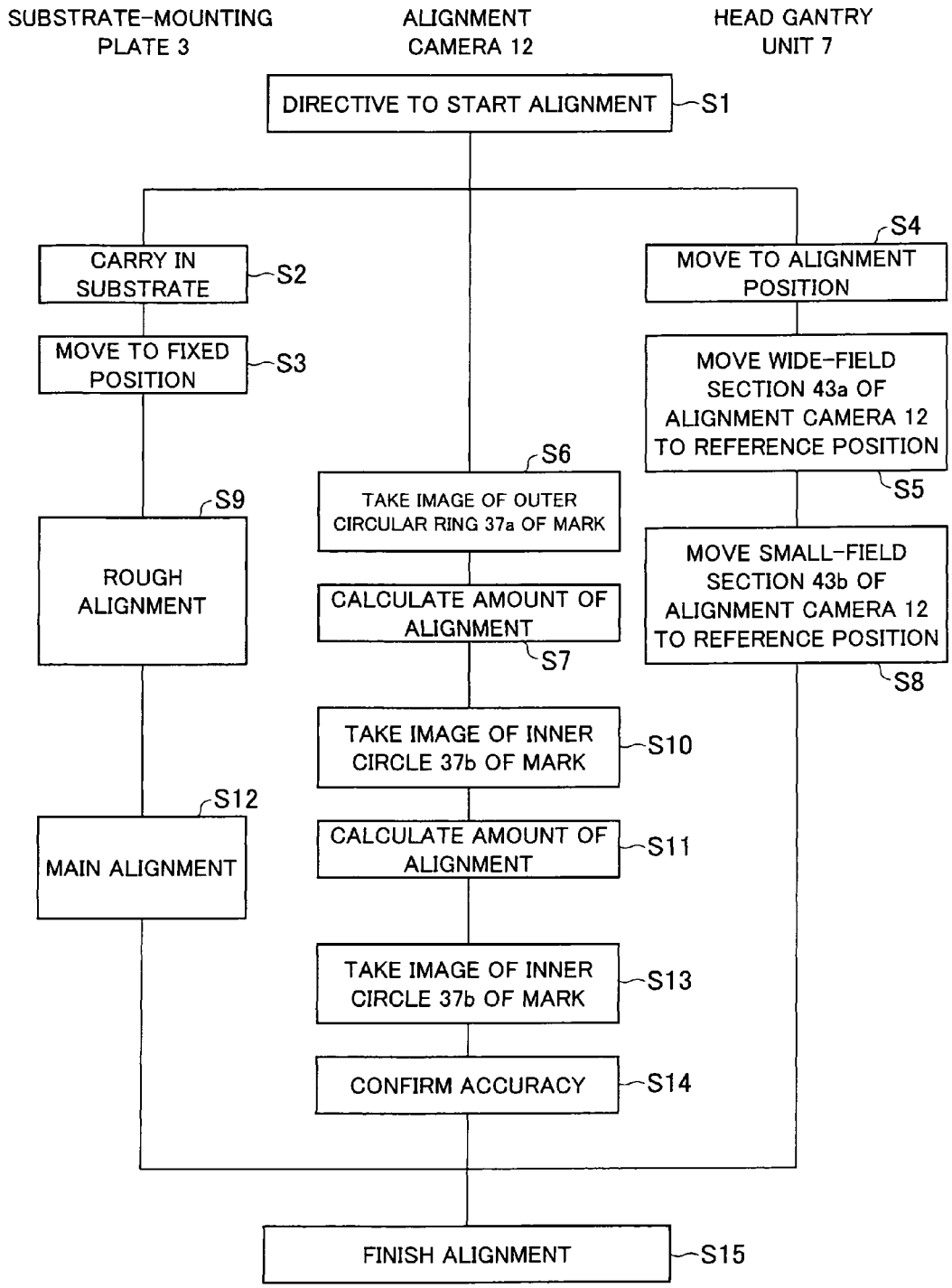

FIG. 14 is a flow chart showing the alignment operation of the defect repairing apparatus.

(a) and (b) of FIG. 15 are plan views for explaining an operation in which an observation camera unit of the defect repairing apparatus finds droplet landing positions.

(a) and (b) of FIG. 16 are plan views for explaining a back-and-forth motion of the head gantry unit of the defect repairing apparatus.

(a) and (b) of FIG. 17 are plan views for explaining an operation of the head gantry unit with respect to a target substrate.

(a) through (d) of FIG. 18 are schematic plan view for explaining an operation of each droplet discharge unit with respect to defective parts.

(a) through (c) of FIG. 19 are schematic plan views showing a case where a droplet discharge unit that drops three types of droplet material performs a discharging operation by moving in a direction orthogonal to longer sides of pixels.

(a) through (c) of FIG. 20 are schematic plan views showing a case where a droplet discharge unit that drops three types of droplet material performs a discharging operation by moving in a direction parallel to longer sides of pixels.

(a) of FIG. 21 is a plan view of an arrangement of head gantry units of a defect repairing apparatus according to Embodiment 2, and (b) of FIG. 21 is a plan view for explaining an operation thereof.

Figure 22:
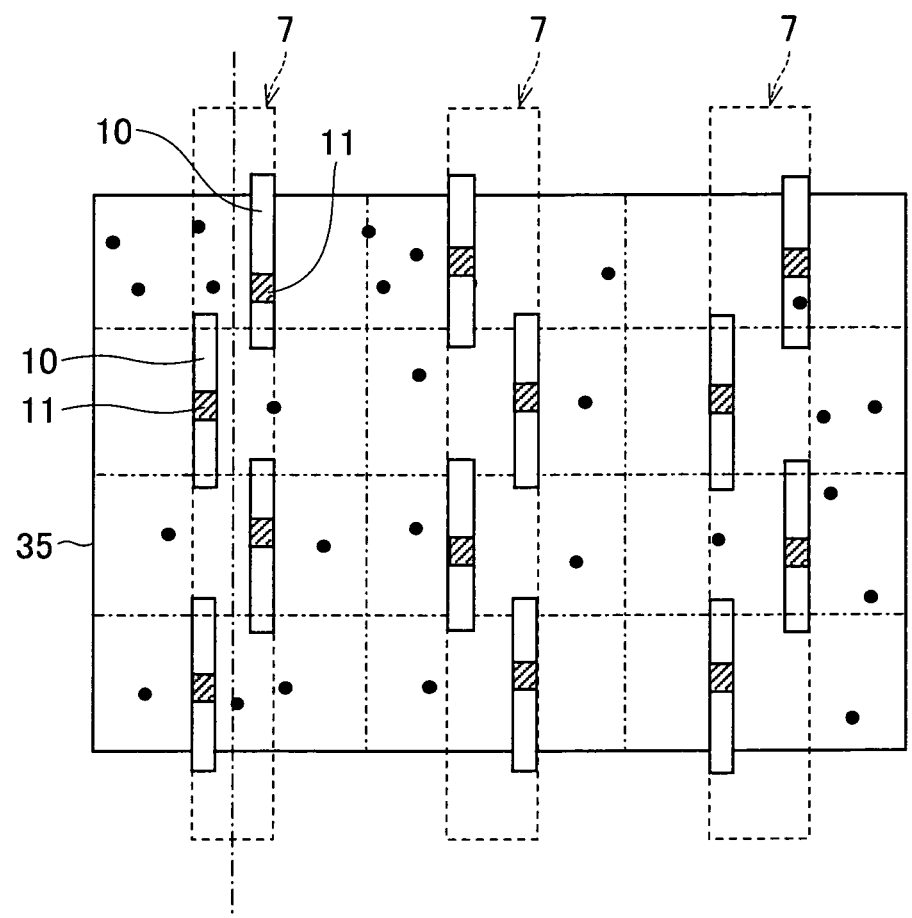

FIG. 22 is a plan view of another arrangement of head gantry units of the defect repairing apparatus according to Embodiment 2.

(a) and (b) of FIG. 23 are plan views of still another arrangement of a head gantry unit of the defect repairing apparatus according to Embodiment 2.

REFERENCE NUMERALS

1 Defect repairing apparatus
2 Substratum
2a Main stage
2b, 2c Sub-stage
3 Substrate-mounting plate (fixing means)
4 Gantry sliding mechanism (moving means)
5a, 5b, 5c Gantry guide
6 Linear scale
7 Head gantry unit (gantry)
8 Floating sliding mechanism
9 Gantry
10 Discharge-unit sliding mechanism (sliding mechanism)
11 Droplet discharge unit
11a to 11i Droplet discharge unit
12 Alignment camera
13 Camera sliding mechanism
14 Observation camera unit
15 Maintenance mechanism
16 Housing
17 Discharge element
18 Drive control circuit
19 Cable
20 Ink tank
21 Ink tube
22 Nozzle plate
23 Nozzle hole
24 Linear driving mechanism
25 LM guide
26 Gantry linear scale
27 Linear driving mechanism
28 Camera sliding mechanism
29 LM guide
30 Camera liner scale
31 Cap member
32 Non-discharge detector
33 Laser-emitting element
34 Laser-receiving element
35 Target substrate
36 Alignment mark
37a Outer circular ring
37b Inner circle
38 Dummy substrate
39 Droplet landing position
40 Defect (defective part)
41 Region (repair region)

BEST MODE FOR CARRYING OUT THE INVENTION

An embodiment of the present invention will be described below with reference to FIGS. 1 through 23.

(Embodiment 1)

<Description of the Arrangement of an Apparatus as a Whole>

Figure 1:
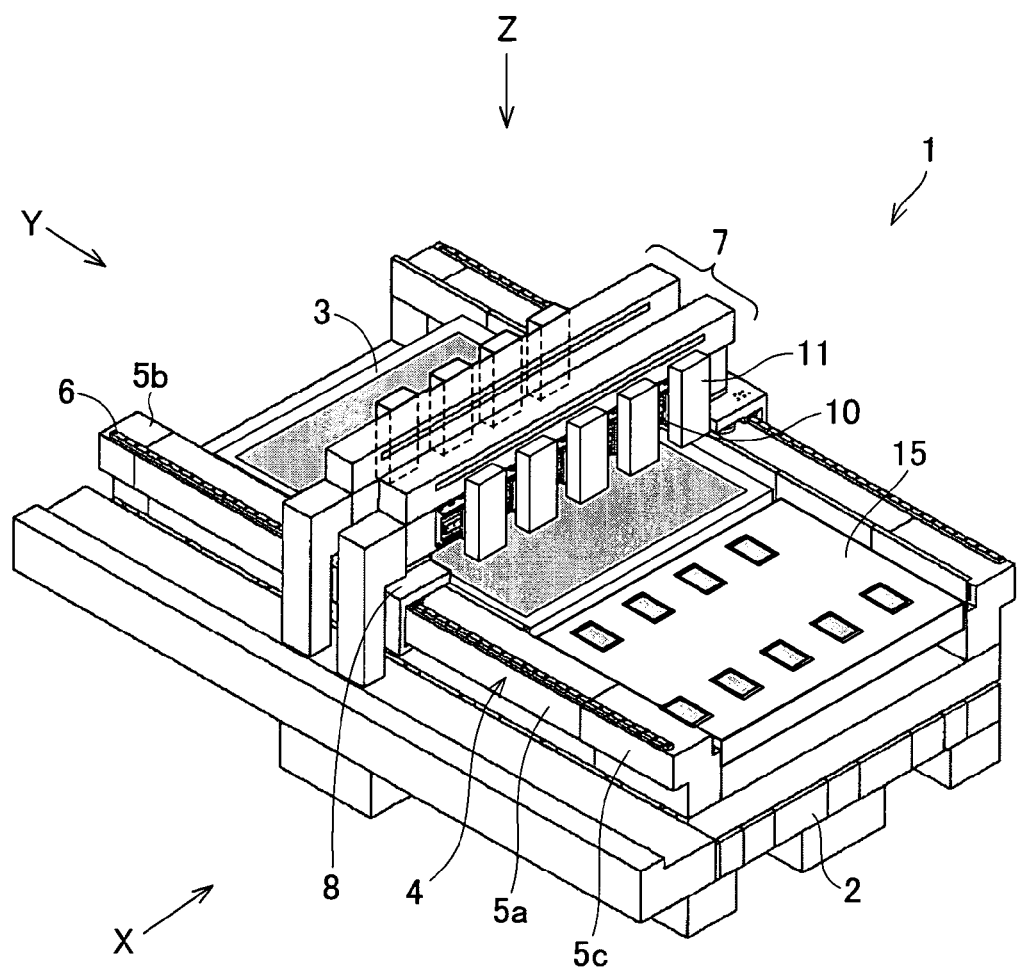
FIG. 1 is a perspective view of the appearance of a defect repairing apparatus according to Embodiment 1.
Figure 2:
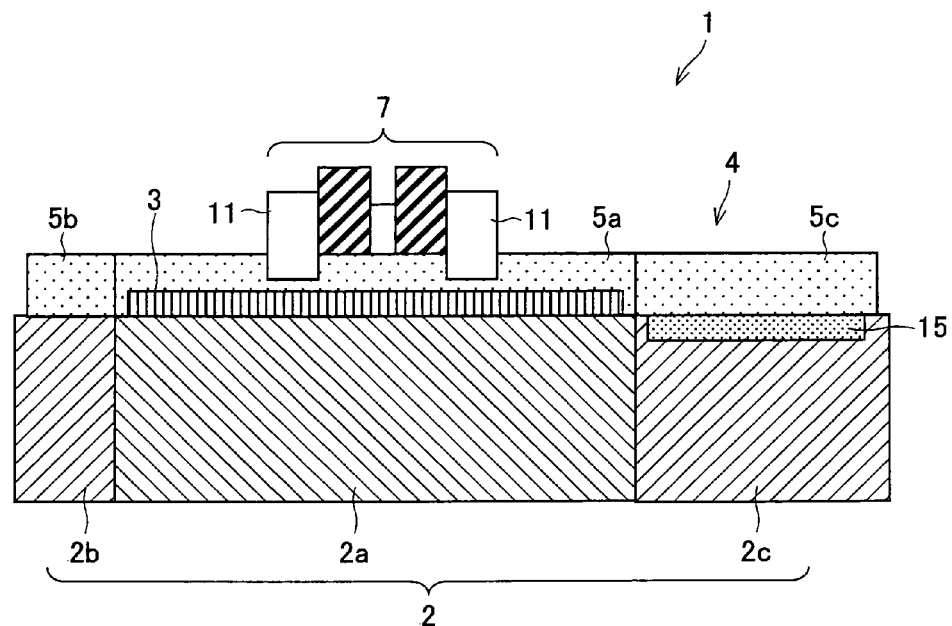
FIG. 2 is a schematic cross-sectional view of the defect repairing apparatus.

FIG. 1 is a perspective view of the appearance of a defect repairing apparatus 1 according to Embodiment 1. FIG. 2 is a schematic cross-sectional view of the defect repairing apparatus 1.

The defect repairing apparatus 1 includes a substratum 2. The defect repairing apparatus 1 is provided with: a substrate-mounting plate 3, mounted on the substratum 2, which moves when substrates are carried in and out; and a head gantry unit 7 extending transversely above the substrate-mounting plate 3 without making contact with the plate. The head gantry unit 7 is arranged to be able to move back and forth along one direction (i.e., along a direction parallel to Direction Y of FIG. 1) by a gantry sliding mechanism 4 linked to the substratum 2.

Mounted on side surfaces of the head gantry unit 7 are discharge-unit sliding mechanisms 10 capable of moving droplet discharge units 11 along a direction (i.e., along a direction parallel to Direction X of FIG. 1) different from the directions of movement of the head gantry unit 7 (i.e., from a direction parallel to Direction Y of FIG. 1). The droplet discharge units 11, mounted on the discharge-unit sliding mechanisms 10, can move along a direction (i.e., along a direction parallel to Direction X of FIG. 1) different from the directions of movement of the head gantry unit 7 within a range of regions on the discharge-unit sliding mechanisms 10 where the droplet discharge units 11 can move.

The number of droplet discharge units 11 mounted on the side surfaces of the head gantry unit 7 is a plural number (nine in FIG. 1), and the droplet discharge units 11 have their respective discharge-unit sliding mechanisms 10. Moreover, the plurality of droplet discharge units 11 move on their respective discharge-unit sliding mechanisms 10 each independently in a direction parallel to Direction A of FIG. 1 in accordance with a control command from the defect repairing apparatus 1.

Further, each of the droplet discharge units 11 has a head discharge surface. The head discharge surface is substantially parallel to the substrate-mounting plate 3, and is formed with holes through which droplets are discharged. In accordance with a control command from the defect repairing apparatus 1, the droplet discharge unit 11 drops droplets through the head discharge surface onto a target substrate mounted on the substrate-mounting plate 3.

Provided on the substratum 2 of the apparatus in addition to the substrate-mounting plate 3 is a maintenance mechanism 15 having a mechanism for capping the discharge surface of the droplet discharge unit 11 when the droplet discharge unit 11 is not being used, a mechanism for detecting a defective discharge outlet in the droplet discharge unit 11, a mechanism for repairing the defective discharge outlet, and the like. At the time of maintenance, the gantry sliding mechanism 4 causes the head gantry unit 7 to move so as to be directly above the maintenance mechanism 15, and the maintenance mechanism 15 performs various maintenance operations on the droplet discharge unit 11.

<Description of the Substratum 2 of the Apparatus>

An arrangement of the substratum 2 of the apparatus will be described below with reference to FIG. 2.

The substratum 2 of the apparatus has a centrally-placed main stage 2a. The main stage 2a has mechanical links with sub-stages 2b and 2c provided on both sides thereof. The sub-stage 2c has the maintenance mechanism 15.

The main stage 2a is a high-accuracy stage made of granite, and secures the substrate-mounting plate 3 with accuracy while the droplet discharge unit 11 is discharging droplets onto a target substrate mounted on the substrate-mounting plate 3.

The sub-stage 2c is a stage on which the maintenance mechanism 15 is mounted, and as such does not need to be as accurate as the main stage 2a.

The sub-stage 2b is a stage that is used for moving the substrate-mounting plate 3 to an end of the apparatus in carrying in a substrate onto the substrate-mounting plate 3 or in carrying out a substrate from the surface of the substrate-mounting plate 3.

The stages 2a, 2b, and 2c have gantry guides 5a, 5b, and 5c mounted thereon, respectively. The gantry guides 5a, 5b, and 5c are linked together with seams formed therebetween, in order that the head gantry unit 7 can freely slide across the gantry guides 5a, 5b, and 5c.

In FIG. 1, the head gantry unit 7 is always staying up in the air with a floating sliding mechanism 8 floating above the gantry sliding mechanism 4. It is linear motor control between a magnetic linear scale 6 provided on the gantry sliding mechanism 4 and the floating sliding mechanism 8 that enables the head gantry unit 7 to move.

Moreover, the gantry sliding mechanism 4 and the linear scale 6 are continuously arranged so that the head gantry unit 7 can freely slide across the stages 2a, 2b, and 2c. Further, the substratum 2 of the apparatus has a conventional vibration-free mechanism (not shown) provided on a ground surface thereof.

<Description of the Substrate-Mounting Plate 3>

The substrate-mounting plate 3 has a plurality of minute holes (not shown) formed on an upper surface thereof, and all of the holes are in communication with a suction/blower mechanism (not shown) that performs suction/blower control so that a target substrate disposed on the substrate-mounting plate 3 is fixed by suction or released from the substrate-mounting plate 3.

Figure 3:
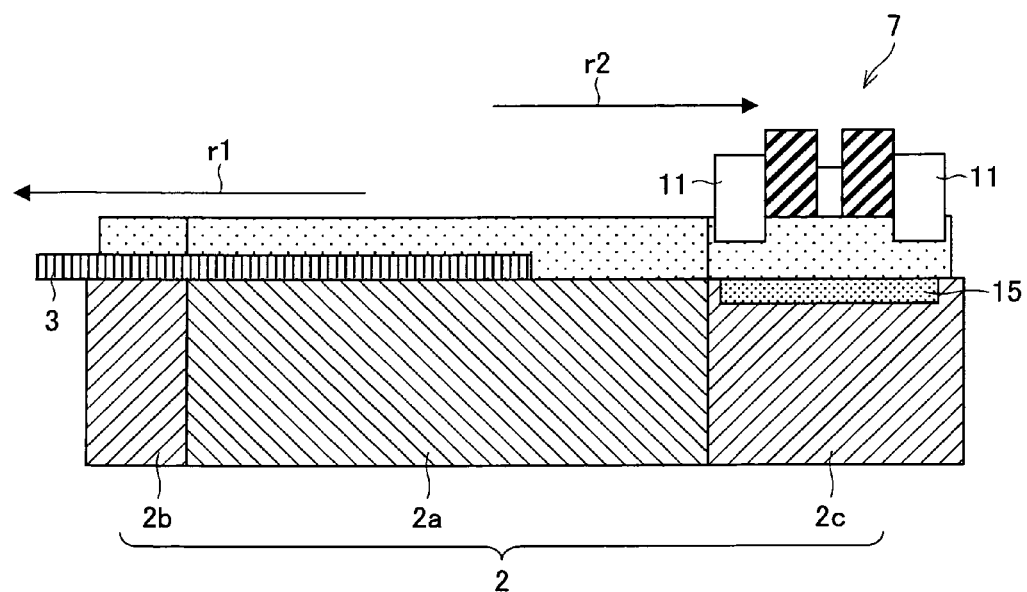
FIG. 3 is a schematic cross-sectional view for explaining the operation of a head gantry unit and a substrate-mounting plate of the defect repairing apparatus.

FIG. 3 is a schematic cross-sectional view for explaining the operation of the head gantry unit 7 and the substrate-mounting plate 3 of the defect repairing apparatus 1. The substrate-mounting plate 3 can move by liner motor control on slide rails (not shown) provided on the substratum 2 of the apparatus. At the time of carrying in or out a substrate, the substrate-mounting plate 3 moves along the direction of an arrow r1 to an end of the apparatus opposite the maintenance mechanism 15 as shown in FIG. 3.

Furthermore, the substrate-mounting plate 3 contains a theta rolling mechanism (not shown) that enables the substrate-mounting plate 3 to move on the slide rails along one direction by linear motor control and enables a substrate mounted thereon to rotate freely in an in-plane direction.

Furthermore, the substrate-mounting plate 3 has a fine-adjustment mechanism that enables the substrate-mounting plate 3 to move slightly in a direction orthogonal to the slide rails. Further, the upper surface of the substrate-mounting plate 3 is made of a stationary stone platen whose upper surface is high in flatness, and is parallel to the discharge surface of the droplet discharge unit 11.

<Description of the Head Gantry Unit 7>

(a) and (b) of FIG. 4 are a plan view and a front view of an arrangement of a main part of the head gantry unit 7 as seen from Directions Z and Y, respectively. The arrangement of the head gantry unit 7 will be described below with reference to (a) and (b) of FIG. 4.

The head gantry unit 7 is constituted by linking a pair of gantries 9 together via the floating sliding mechanism 8. Provided on an outward side surface of one of the gantries 9 are a plurality of (four in FIG. 1) droplet discharge units 11 and a plurality of (four in FIG. 1) discharge-unit sliding mechanisms 10.

Installed fixedly on a surface opposite the outward surface so as to be located between the two gantries 9 are two alignment cameras 12 for use in control of the in-plane rotation of a substrate. Although (a) and (b) of FIG. 4 show only one of the alignment cameras 12, the other alignment camera 12 is at the top of (a) of FIG. 4.

Similarly provided on an outward side surface of the other gantry 9 are a plurality of (five in FIG. 1) droplet discharge units 11 and a plurality of (five in FIG. 1) discharge-unit sliding mechanisms 10. Movably attached via a camera sliding, mechanism 13 to a surface opposite the outward surface so as to be located between the two gantries 9 is an observation camera unit 14. The camera sliding mechanism 13 enables the observation camera unit 14 to move along a long side of the gantry 9.

<Description of the Gantry Slide Mechanism 4>

The gantry sliding mechanism 4 causes the floating sliding mechanism 8 to stay up in the air above the gantry sliding mechanism 4, and performs linear drive control together with the floating sliding mechanism 8, thereby causing the head gantry unit 7 to move to any position along a direction parallel to Direction Y of FIG. 1, in accordance with a control signal from the defect repairing apparatus 1.

<Description of the Droplet Discharge Units 11>

FIG. 5 is a side view of an arrangement of a main part of each of the droplet discharge units 11 as seen from Direction Y of FIG. 1. The droplet discharge units 11 are mounted on their respective discharge-unit sliding mechanisms 10 installed on the head gantry unit 7, and can move each independently in the directions of an arrow r3.

Each of the droplet discharge units 11 has a discharge element 17, a drive control circuit 18, an electric connection cable 19, an ink tank 20, an ink tube 21, and a housing containing them. It is the housing 16 that moves on the corresponding discharge-unit sliding mechanism 10.

The discharge element 17 has a nozzle plate 22 bonded to a surface thereof parallel to the upper surface of the substrate-mounting plate 3, and the nozzle plate 22 has a plurality of nozzle holes 23 formed therein. It should be noted that each of the nozzle holes 23 has a diameter of 10 μm to 20 μm.

The discharge element 17 is a conventional one that generates discharging energy by forming, in a piezoelectric substrate, groves that serve as a plurality of ink chambers, forming an electrode in a portion of a side surface of a dividing wall, and then subjecting the dividing wall to shear deformation through application of an electric field between both side surfaces of the dividing wall. The drive control circuit 18 is connected to a drive control system (not shown) via a cable (not shown) to perform discharge control. A preliminary adjustment is made so that the space between a droplet discharge surface, i.e., a lowermost surface of the nozzle plate 22 and an upper surface of a target substrate mounted on the substrate-mounting plate 3 is 0.5 mm to 1 mm.

<Description of the Discharge-Unit Sliding Mechanisms 10>

FIG. 6 is a front view of an arrangement of a main part of each of the discharge-unit sliding mechanisms 10 as seen from Direction X of FIG. 1. The arrangement of the discharge-unit sliding mechanism 10 will be described below with reference to FIG. 6.

The discharge-unit sliding mechanism 10 is composed of two LM guides 25 (manufactured by THK Co. Ltd.) and a gantry linear scale 26 installed between the two LM guides 25. Control of drive of a linear driving mechanism 24 attached to the corresponding droplet discharge unit 11 makes it possible to move the droplet discharge unit 11 to a predetermined position along a direction parallel to Direction X of FIG. 1 (i.e., along a direction perpendicular to the surface of FIG. 6). The linear scale 26 is a regular array of permanent magnets whose north and south poles alternate with one another.

The linear driving mechanism 24 can freely generate north and south poles by means of alternating-current control, and the magnetic force of the linear scale 26 and the linear driving mechanism 24 enables position control of the droplet discharge unit 11 on the discharge-unit sliding mechanism 10. The effective stroke of each of the LM guides 25 is 250 mm, and the linear scale 26 is installed within a range of not more than the effective stroke. The movement of the droplet discharge unit 11 by the discharge-unit sliding mechanism 10 is adjusted in advance so that the gap between the upper surface of the substrate-mounting plate 3 and the nozzle plate 22, which is a droplet discharge surface of the droplet discharge unit 11, is always constant. The gap is adjusted, for example, to be not less than 0.2 mm to not more than 0.8 mm. Generally, when the gap is set to be not more than 0.2 mm, there is a higher possibility of causing a failure in the apparatus due to contact of the head with the surface of a substrate and there are fears that minute splashes made when droplets lands on the substrate reach the nozzle surface, accumulate on the nozzle surface, and form large droplets. On the other hand, when the gap is set to be not less than 0.8 mm, there is deterioration in landing accuracy due to the influence of wind at the time of flight of droplets. Those discharge-unit sliding mechanisms 10 provided on the side surface of the other gantry 9 will not be described below, because they are identical in arrangement to those described above.

<Description of a Camera Sliding Mechanism 28>

An arrangement of the camera sliding mechanism 28 will be described below with reference to FIG. 6. The function of the gantry sliding mechanism 4 to acquire information along a direction parallel to Direction Y and the function of the camera sliding mechanism 28 to acquire information along a direction parallel to Direction X enable the observation camera unit 14 to output address information on a target substrate with respect to alignment marks. The observation camera unit 14 mainly observes a landing image of droplets that the droplet discharge unit 11 has caused to land on the substrate, and can output the condition of discharge from each of the droplet discharge units 11 or the address of a landing position with respect to the alignment marks.

Use of the landing position coordinates obtained by the observation camera unit 14 enables each of the droplet discharge units 11 to cause droplets to land on an intended position on the target substrate by correcting the timing of discharge with respect to Direction Y and correcting the amount of movement of the corresponding discharge-unit sliding mechanism 10 with respect to Direction X.

As with each of the aforementioned discharge-unit sliding mechanisms 10, the camera sliding mechanism 28 is composed of two LM guides 29 (manufactured by THK Co. Ltd.) and a camera linear scale 30 installed between the two LM guides 29. Control of drive of a linear driving mechanism 27 attached to the observation camera unit 14 makes it possible to move the observation camera unit 14 to a predetermined position along Direction X of FIG. 1 (i.e., along a direction perpendicular to the surface of FIG. 6). The effective stroke of each of the LM guides 29 is 2500 mm, and the linear scale 30 is installed within a range of not more than the effective stroke.

<Array of Nozzle Holes>

(a) of FIG. 7 is a bottom view of an arrangement of a main part of each of the droplet discharge units 11, and (b) of FIG. 7 is a bottom view of an arrangement of a main part of another droplet discharge unit 11a. An array of nozzles holes in each of the droplet discharge units will be described below with reference to (a) and (b) of FIG. 7. (a) of FIG. 7 shows an apparatus equipped with a plurality of droplet discharge units 11 that discharge one type of liquid. The head gantry unit 7 has the droplet discharge units 11 attached thereto via their respective discharge-unit sliding mechanism 10 so as to be able to move along the direction of the arrow X (FIG. 1). The nozzle holes 23 formed in the nozzle plate 22, which is a droplet discharge surface, are arrayed in a line inclined at several degrees with respect to a direction perpendicular to the arrow B. All the nozzle holes 23 thus arrayed discharge the same droplet material.

(b) of FIG. 7 shows an apparatus having a plurality of droplet discharge units 11a each equipped with a plurality of nozzle plates that discharge three types of liquid. Each of the droplet discharge units 11a is arranged so as to have a line of nozzle holes 23R that discharge a first droplet material, a line of nozzle holes 23G that discharge a second droplet material, and a line of nozzle holes 23B that discharge a third droplet material, the lines of nozzles holes being each inclined at several degrees with respect to a direction perpendicular to Directions B, the lines of nozzle holes being substantially identical in projected area to one another in Direction B. Further, each of the lines of nozzle holes may be able to move slightly in Directions B within the droplet discharge unit 11a.

The nozzle pitch Q projected in Directions B is defined as:

$$Q = p \times \sin \theta,$$

where θ denotes the inclination of a line of nozzle holes to Directions A and p denotes the nozzle pitch. This brings about an advantage of increasing the density of the pitch Q in Directions B in comparison with the actual nozzle pitch. An increase in density of the pitch Q makes it possible to manufacture a single unit through a combination of a plurality of heads while arraying the heads at least within the accuracy of the pitch Q without strictly aligning each of the heads.

It is preferable to use discharge elements, inclined at θ=3 to 10°, each of which has 20 to 80 nozzle holes at a pitch of 100 to 200 DPI (i.e., an array of 100 to 200 holes at equal pitches per width of 1 inch). The reason for this is as follows: As the number of holes per discharge unit becomes smaller, the total width of a droplet discharge unit composed of an array of such discharge units becomes smaller, so that a region of incapability can be made smaller. Further, the inclination of the 100 to 200 DPI discharge elements, which are low in manufacturing cost, within the range of θ=3 to 10° makes it possible that the nozzle pitch projected in Directions B is made as high as 5 μm to 35 μm in density once control of the timing of discharge is performed by performing a test discharge, without strictly aligning the plurality of discharge elements with one another. This makes it possible to realize an array higher in density than the size of pixels of a color filter, an organic EL display device, or the like.

<Description of an Operation of Carrying in a Substrate>

(a) through (c) of FIG. 8 are schematic cross-sectional views for explaining the operation of the head gantry unit 7 and the substrate-mounting plate 3 as seen from Direction X of FIG. 1.

(a) of FIG. 8 shows a state where a target substrate 35 has been processed. After the substrate has been processed, as shown in (b) of FIG. 8, the substrate-mounting plate 3 of the defect repairing apparatus slides in the direction of the arrow r1 toward the left on the drawing, and the head gantry unit 7 moves in the direction of the arrow r2 so as to be directly above the maintenance mechanism 15. Then, after the substrate-mounting plate 3 has released the suction of the target substrate 35 thus processed, the substrate-mounting plate 3 transfers the target substrate 35 to a conveyer robot (not shown). After that, the conveyer robot places a next target substrate 35a onto the substrate-mounting plate 3. Then, the target substrate 35a thus placed is immediately air-sucked by the substrate-mounting plate 3, which then returns to its original position (i.e., the position shown in (a) of FIG. 8).

During the carrying out of the target substrate 35 from the substrate-mounting plate 3, the carrying in of the next target substrate 35a, and the return of the substrate-mounting plate 3 to its original position, each of the droplet discharge units 11 is subjected to a routine maintenance operation. In the maintenance operation, the head gantry unit 7 moves so as to be directly above the maintenance mechanism 15, and maintenance work is performed after completion of the movement. Specifically, as shown in (b) of FIG. 8, the nozzle plate surface of the droplet discharge unit 11 is capped with a cap member 31 made of rubber. Further, after the capping, the liquid is forcibly drained from the nozzle holes of the nozzle plate by negative-pressure suction through an air vent provided at the bottom of the cap member 31, so that dust and the like are removed from the nozzle holes. After that, the nozzle plate surface is wiped with a wiper blade (not shown). Then, the after-mentioned non-discharge detector checks the condition of discharge from the nozzle holes. This series of maintenance actions may be arranged in an order different from the aforementioned order.

The substrate-mounting plate 3 on which the new target substrate 35a has been mounted and the head gantry unit 7 finished with the maintenance operation of the droplet discharge unit 11 moves substantially simultaneously in the directions of arrows r4 and r5 shown in (c) of FIG. 8 and reach the positions shown in (a) of FIG. 8, respectively.

<Description of a Maintenance Operation>

During the carrying out and in of substrates or when an operation of discharging droplets onto a substrate is not performed for a long period of time, each of the droplet discharge units 11 is subjected to a maintenance operation. This maintenance operation includes a non-discharge detecting action, a capping action, an action for sucking and purging the interior of a cap, and a wiping action. In cases where the next target substrate is processed immediately after the previous target substrate has been processed, the head gantry unit 7 equipped with the droplet discharge units 11 is given a command to move so as to be directly above the maintenance mechanism 15, at the same time as a command to carry out the previous target substrate is given.

(a) and (b) of FIG. 9 are a front view and a bottom view of an arrangement of a non-discharge detector 32 as seen from Directions X and Z of FIG. 1, respectively. The maintenance mechanism 15 has non-discharge detectors 32, installed respectively for the droplet discharge units 11, each of which has a laser-emitting element 33 and a laser-receiving element 34.

Upon receiving a non-discharge detecting command, the laser-emitting element 33 and a laser-emitting circuit (not shown) continuously irradiate the laser-receiving element 34 with a laser beam. Connected to the laser-receiving element 34 is a circuit for measuring the amount of light received. Stored in the circuit is the normal amount of light received. As shown in (a) and (b) of FIG. 9, the direction of laser irradiation is substantially parallel to the surface of the substrate and the surface of the nozzle plate 22, and is substantially parallel to the lines of nozzle holes 23R, 23G, and 23B. The laser beam has a diameter of 1 mm, and a single droplet discharge unit 11a is disposed so that all the nozzle holes 23R, 23G, and 23B discharge droplets that pass through within the axis of the laser beam.

Each of the laser-emitting element 33 and the laser-receiving element 34 has a micromotion mechanism. If droplets do not pass through within the axis of the laser beam, a positional adjustment is made. First, the amount of light from the means for measuring the amount of light received is read while causing the first nozzle holes 23R to discharge droplets for a certain period of time. The amount of light blocked is measured by comparing the read mount of light received with the normal amount of light received. It is judged whether or not the measured value falls within a range of preset values. In cases where the measured value falls within the range of preset values, it is deemed to represent a normal discharge; otherwise, it is deemed to represent a defective discharge.

Next, the control of discharge and the measurement of the amount of light blocked are performed in sequence for the second nozzle holes 23G and the third nozzle holes 23B in the same manner, whereby all the nozzle holes 23R, 23G, and 23B of the droplet discharge unit 11 is checked for the existence of a defective discharge. In the absence of a defective discharge, the droplet discharge unit 11 is moved to the capping position, and then capped until right before completion of the operation of carrying in a substrate.

In the presence of a defective discharge, a recovery operation is performed as in the case of a conventional technology. For example, the droplet discharge unit 11 is moved to the capping position, and then capped. Next, the cap is subjected to negative pressure for forcible drainage from the nozzle holes. After that, the cap is released, and then wiping is performed. Once again, non-discharge detection is performed.

The non-discharge detection and the recovery operation are performed within the limits of several times until there is no more defective discharge. In cases where no recovery is made from a defective discharge, the apparatus is informed accordingly. In cases where there is a change in the condition of discharge as a result of a comparison between a result of the last non-discharge detection immediately before the previous substrate is processed and a result of the first non-discharge detection performed while the previous target substrate is being carried out, the previous substrate can be discarded as having been processed inadequately or can be passed onto a repairing step.

<Array of Droplet Discharge Units 11>

(a) and (b) of FIG. 10 are plan views for explaining an alignment operation of the defect repairing apparatus 1. (a) and (b) of FIG. 10 shows the defect repairing apparatus 1 as seen from above, and the head gantry unit 7 has a total of nine droplet discharge units 11 mounted thereon.

The discharge-unit sliding mechanisms 10 provided respectively for the droplet discharge units 11 are provided on both outward side surfaces of the head gantry unit 7 as a pair. Specifically, the head gantry unit 7 has four pairs of a droplet discharge unit 11 and a discharge-unit sliding mechanism 10 attached to the left side surface of thereof on the drawings so as to be placed at regular intervals, and has five pairs of a droplet discharge unit 11 and a discharge-unit sliding mechanism 10 attached to the right side surface of thereof on the drawings so as to be placed at regular intervals. Moreover, the discharge-unit sliding mechanisms 10 are arrayed in a zigzag pattern on the upper surface of the substrate-mounting plate 3. That is, two discharge-unit sliding mechanisms 10 adjacent to each other along a direction orthogonal to the arrow r3, i.e., along the direction of gantry movement are arranged so that their respective slidable regions has edges overlapped partially with each other along the directions of the arrow r3, i.e., along the directions in which the discharge-unit sliding mechanisms 10 can slide. The larger the overlap between the movable regions is, the better. It is desirable that the overlap correspond to not less than ⅓ of the length of longer sides of each of the discharge-unit sliding mechanisms 10.

<Description of a Substrate Alignment Operation>

An operation of aligning a target substrate will be described below with reference to (a) and (b) of FIG. 10 and (a) and (b) of FIG. 11. (a) and (b) of FIG. 11 are plan views of an arrangement of a main part of each of the alignment cameras 12 of the head gantry unit 7. Provided near corners of a target substrate 35 fixed on the substrate-mounting plate 3 by suction are two alignment marks 36 for correcting the direction of in-plane rotation of the target substrate 35.

The two alignment cameras 12 fixed to the head gantry unit 7 move integrally with the head gantry unit 7 from their respective positions shown in (a) of FIG. 10 to the respective positions shown in (b) of FIG. 10. Moreover, a displacement in the direction of in-plane rotation of the target substrate 35 is calculated based on image information from the alignment cameras 12, and the aforementioned theta rolling mechanism and the aforementioned micromotion mechanism for slight movement in the directions of the arrow r3, both of which mechanisms belong to the substrate-mounting plate 3, are used to correct the posture of the target substrate 35 in the direction of a turning arrow r6 shown in (b) of FIG. 10.

The target substrate 35 is provided in advance with the two high-accuracy alignment marks 36, and the position of application of droplets onto the target substrate 35 is predetermined with reference to these alignment marks 36. These alignment marks 36 are concentric marks, and the displacement in pitch of the two alignment marks 36 on the target substrate 35 is not more than 2 μm. The two alignment cameras 12 are installed on the head gantry unit 7 at the same pitch as the two alignment marks 36. Further, each of the alignment cameras 12 has a plurality of mode sections, namely a wide-field mode section 43a and a small-field mode section 43b. The wide-field mode section 43a makes alignment by the theta rolling mechanism and the micromotion mechanism, and then the small-field mode section 43b performs a similar alignment operation once again.

(a) and (b) of FIG. 12 are plan views of main parts for explaining the alignment operation of the defect repairing apparatus. (a) and (b) of FIG. 13 are enlarged plan views of the main parts. (a) and (b) of FIG. 12 schematically show images taken by the alignment cameras 12 in a wide-field mode. (a) of FIG. 12 shows an image taken by one of the pair of alignment cameras 12, and (b) of FIG. 12 shows an image taken by the other alignment camera 12.

The wide-field mode of each of the alignment cameras 12 is designed so as to have a field of view that is not less than the accuracy with which the conveyor robot disposes a substrate onto the substrate-mounting plate 3. In this wide-field mode, first, the posture of the target substrate 35 is controlled by measuring a displacement of each alignment mark 36 from its reference position with use of an outer circular ring 37a having the same center as the alignment mark 36 and by adjusting the substrate-mounting plate 3 by the theta rolling mechanism and the fine-adjustment mechanism so that the alignment mark 36 corresponds to the reference position. The outer circular ring 37a has an outside diameter, for example, of 2 mm, and an inner circle 37b has an outside diameter, for example, of 0.2 mm.

Next, as shown in (a) and (b) of FIG. 13, each of the alignment cameras 12 is switched to a small-field mode in which the posture of the target substrate 35 is controlled by measuring a displacement of each alignment mark 36 from its reference position with use of an inner circle 37b having the same center as the alignment mark 36 and by adjusting the substrate-mounting plate 3 by the theta rolling mechanism and the fine-adjustment mechanism so that the alignment mark 36 corresponds to the reference position. Further, the positions of observation by the pair of alignment cameras 12 and the positions of discharge of droplets by the droplet discharge units 11 are measured in advance in an adjustment step after installation of the droplet discharge units 11.

FIG. 14 is a flow chart showing the alignment operation of the defect repairing apparatus 1. First, when a control unit of the defect repairing apparatus 1 issues a directive to start alignment (Step S1), a target substrate 35 is carried in onto the substrate-mounting 3, which have moved to the sub-stage 2b (Step S2). Then, the substrate-mounting plate 3, on which the target substrate 35 has been mounted, moves to a fixed position on the main stage (Step S3).

Then, as shown in (a) of FIG. 10, the head gantry unit 7, which has been above the maintenance mechanism 15, moves to the alignment position shown in (b) of FIG. 10 (Step S4). Then, the wide-field mode sections 43a of the alignment cameras 12 are moved to the reference positions on the alignment marks 36, respectively (Step S5).

Next, the wide-field mode sections 43a the alignment cameras 12 take images of the outer circular rings 37a of the alignment marks 36, respectively (Step S6), and then the amount of alignment is calculated (Step S7). After that, a rough alignment operation of roughly adjusting the position of the substrate-mounting plate 3 is performed in accordance with the amount of alignment thus calculated (Step S9).

Then, the small-field mode sections 43b of the alignment cameras 12 are moved to the reference positions on the alignment marks 36, respectively (Step S8). After that, the small-field mode sections 43b of the alignment cameras 12 take images of the inner circles of 37b of the alignment marks 36, respectively (Step S10), and then the amount of alignment is calculated (Step S1). After that, a main alignment operation of precisely adjusting the position of the substrate-mounting plate 3 is performed in accordance with the amount of alignment thus calculated (Step S12).

After that, the small-field mode sections 43b of the alignment cameras 12 again take images of the inner circles of 37b of the alignment marks 36, respectively (Step S13), and then the accuracy of position of the substrate-mounting plate 3 is confirmed (Step S14). Thus, the alignment operation is finished (Step S15).

<Measurement of Droplet Landing Positions by the Observation Camera Unit 14>

(a) and 5(b) of FIG. 15 are plan views for explaining an operation in which the observation camera unit 14 of the defect repairing apparatus 1 finds droplet landing positions. The observation camera unit 14 is used in acquiring information for correcting a landing position after replacement of the droplet discharge element 17 (FIG. 5) of a droplet discharge unit 11 or in reconfirming a landing position during use. The observation camera unit 14 can take an image of any position on an upper surface of the defect repairing apparatus 1 by the gantry sliding mechanism 4 and the camera sliding mechanism 28, and can also determine any position on the upper surface of the defect repairing apparatus 1. Information on an image-taking position of the observation camera unit 14 can be outputted through scales incorporated respectively in the gantry sliding mechanism 4 and the camera sliding mechanism 28.

In the case of observation of droplet landing positions, a dummy substrate 38 marked with the same predetermined alignment marks 36 as a normal target substrate 35 is carried into the defect repairing apparatus 1, and the posture of the substrate is controlled as usual. Next, the observation camera unit 14 takes images of the two alignment marks 36 on the dummy substrate 38, respectively, and then acquires position information thereon.

As shown in (a) of FIG. 15, the head gantry unit 7 moves to any position on the dummy substrate 38. Then, the droplet discharge units 11 discharge droplets toward the dummy substrate 38 through the nozzle holes. In so doing, the droplet discharge units 11 may discharge droplets through all the nozzle holes. Further, the droplet discharge units 11 recognize virtual landing positions (ideal landing positions) in accordance with the scale incorporated in the gantry sliding mechanism 4 and scales incorporated in the discharge-unit sliding mechanisms 10, respectively.

Next, as shown in (b) of FIG. 15, the observation camera unit 14 takes images of droplet landing positions 39 in sequence while being moved by the gantry sliding mechanism 4 and the camera sliding mechanism 28, and then determines actual landing positions with respect to the alignment marks 36. Then, differences between the virtual landing positions and the actual landing position are stored as data for correcting the droplet discharge units 11, respectively. Each of the displacements (differences) is decomposed into an X-direction displacement and a Y-direction displacement. The Y-direction displacement can be corrected by adjusting the timing of discharge, because the head gantry unit 7 discharges droplets while moving in Direction Y. The X-direction displacement is corrected by offsetting the amount of movement of each of the discharge-unit sliding mechanisms 10. This operation of the observation camera unit 14 also makes it possible to detect the absence of discharge for each nozzle and detect a displacement in landing for each nozzle.

<Back-and-Forth Motion of the Head Gantry Unit 7/Moving Operation of the Droplet Discharge Units 11>

(a) and (b) of FIG. 16 are plan views for explaining a back-and-forth motion of the head gantry unit 7. The following shows how to drop droplets onto intended positions with reference to alignment marks 36 of a target substrate 35 whose posture has been controlled.

(a) of FIG. 16 shows a state where the head gantry unit 7 has moved to its rightmost position in a work operation of dropping droplets onto the target substrate 35. Meanwhile, (b) of FIG. 16 shows a state where the head gantry unit 7 has moved to its leftmost position. The head gantry unit 7 moves back and forth once or more than once within a range shown by an arrow r7. The plurality of droplet discharge units 11 mounted on the head gantry unit 7 can be move each independently in directions shown by the arrow r3 of (a) of FIG. 16. The head gantry unit 7 itself moves above the target substrate 35 in the directions from side to side on the drawing (in the directions of the arrow r7). Before performing a droplet-discharging operation, each of the droplet discharge units 11 moves to an intended address along the directions of the arrow r3 and stops there. Then, the droplet discharge unit 11 discharges droplets at a point of time where the directions of the arrow r7 and the directions of the arrow r3 coincide in address of the intended position while the head gantry unit 7 is moving back and forth in the directions of the arrow r7. The respective operations of the plurality of droplet discharge units 11 are controlled each independently.

In (b) of FIG. 16, the moving range of the head gantry unit 7 as shown by the arrow r7 is wider than that width of the substrate which extends in a direction orthogonal to the directions of movement of each of the droplet discharge units 11. The moving range of the head gantry unit 7 is centered substantially on the center line of the width of the substrate.

Since each of the droplet discharge units 11 can thus move across a range wider than the width of the substrate, the droplet discharge unit 11 becomes able to drop droplets onto an intended position (strip-shaped region) on the substrate within the range of movement strokes of the head gantry unit 7.

<Specific Example of a Discharging Operation>

(a) and (b) of FIG. 17 are plan views for explaining an operation of the head gantry unit 7 with respect to a target substrate 35. The head gantry unit 7 is provided with nine droplet discharge units 11a, 11b, 11c, 11d, 11e, 11f, 11g, 11g, 11h, and 11i capable of moving each independently along Direction X, and the droplet discharge units 11a to 11i are set to be responsible for regions 41a, 41b, 41c, 41d, 41e, 41f, 41g, 41g, 41h, and 41i located on the target substrate 35, respectively.

Having dimensions of approximately 2.2 m×2.8 m, the target substrate 35 has approximately 30 to 300 discharging spots (defects) scattered about thereon. In cases where there are not less than 30 defects, an arrangement in which a plurality of droplet discharge units move individually in a direction different from the direction of conveyance brings about a greater takt-time shortening effect in comparison with the case of a single droplet discharge unit, albeit depending on the size of a substrate. Meanwhile, in cases where there are not more than 300 defects, color unevenness due to repaired portions of a repaired color filter substrate or organic EL display substrate becomes nonproblematic for actual use, so that the substrate can be obtained with high quality.

The droplet discharge units 11a to 11i are assigned to their respective regions 41a to 41i shaped into stripes extending in a transverse direction on the drawings. The droplet discharge unit 11a is responsible for the region 41a. The droplet discharge unit 11b is responsible for the region 41b. The droplet discharge units 11a to 11i perform droplet-discharging operations on discharging spots (defects) 40 scattered about on the regions 41a to 41i, respectively.

In the process of moving the head gantry unit 7 back and forth in the directions from side to side on the drawings, the droplet discharge units 11a to 11i move individually along Direction X (FIG. 1), stops at places of coincidence in address along Direction X, and wait until coincidence in address along Direction Y (FIG. 1) while moving along the head gantry unit 7, in order to move so as to be directly above discharging spots 40 for which the droplet discharge units 11a to 11i are responsible, respectively. Then, at such timing that the intended positions on the target substrate 35 are directly below the droplet discharge units 11a to 11i, the droplet discharge units 11a to 11i are driven to discharge droplets onto the intended positions on the target substrate 35 through the discharge outlets, respectively.

When the nine droplet discharge units 11a to 11i are arrayed in two lines in a zigzag pattern as shown in (a) and (b) of FIG. 17, it is possible to assign the droplet discharge units 11a to 11i to their respective regions by dividing the target substrate 35 into the nine regions 41a to 41i as indicated by the dotted lines in the drawings.

(a) through (d) of FIG. 18 are schematic plan view for explaining an discharging operation of each droplet discharge unit 11 with respect to defective parts 40a, 40b, and 40c. The following describes a step at which the droplet discharge unit 11 discharges droplets onto a plurality of rectangular depressed portions (defective parts 40a, 40b, and 40c) while the head gantry unit 7 is moving back and forth. An example of such a step corresponds to a case where a partially defective color filter substrate is repaired with use of the defect repairing apparatus. By way of example, the defect repairing apparatus will be described below with reference to a case where a color filter substrate suffers from a deficiency of a pixel of one color.

The "defective parts" here mean portions obtained by correcting defective portions by a laser or the like so that the defective portions are shaped into depressions of a given shape. Examples of the defective portions include portions commingled with dust in a manufacturing step and portions formed with blank depressions. Assuming that all the droplet discharge units 11 discharge the same type of droplet material, the following shows a method for repairing a deficiency of one type of pixel (red, blue, or yellow). Therefore, defective parts of all the colors can be repaired by either providing three defect repairing apparatus according the present embodiment for separate color materials or, as exemplified in Embodiment 2, arranging a droplet discharge unit to be able to discharge droplets of a plurality of colors.

(a) through (d) of FIG. 18 focus attention on a single one of the plurality of droplet discharge units 11 mounted on the head gantry unit 7, and show, in chronological order, an operation in which the single droplet discharge unit 11 discharges droplets onto a plurality of discharging spots through a droplet discharge surface provided thereon.

(a) of FIG. 18 shows that each of the defective parts (defects) 40a, 40b, and 40c on the processed substrate is a depressed portion, having a width of approximately 2 μm, whose opening has a rectangular shape, having dimensions of approximately 200 μm×70 μm, whose longer sides are parallel to the directions of movement of the head gantry unit 7. (a) through (d) of FIG. 18 are drawn as if the longer sides of each of the defective parts (defects) 40a, 40b, and 40c were parallel to the directions A of movement of the head gantry unit 7. In reality, however, the longer sides of each of the defective parts (defects) 40a, 40b, and 40c are inclined at several degrees as shown in (a) and (b) of FIG. 7. The nozzle discharge surface of the droplet discharge unit 11 faces in parallel with a surface of the conveying stage, and the nozzle plate 22 has a plurality of nozzle holes 23 formed therein. The plurality of nozzle holes 23 are arrayed along the directions from side to side on the drawings, i.e., along the directions of movement of the head gantry unit 7. Each of the nozzle holes 23 has an ink-compressing chamber and compression control means (both not shown) provided on a back surface thereof so as to make it possible to control discharge of droplets. Further, the line of nozzle holes 23 can discharge the same droplet material.

The head gantry unit 7 moves back and forth at a substantially uniform velocity (100 mm/sec to 500 mm/sec) in the directions from side to side on the drawings, regardless of the movement or discharging operation of the droplet discharge unit 11. In order to repair the defective part 40a by discharging droplets onto the defective part 40a, the droplet discharge unit 11 is moved at a high speed with use of the corresponding discharge-unit sliding mechanism 10, and then stopped so that the nozzle holes 23 are aligned with the central line of the defective part 40a. It should be noted that the duration of movement of the droplet discharge unit 11 requires consideration of a period of time containing, in addition to a period of time during which the droplet discharge unit 11 actually moves, a period of stilling time during which residual vibration from the discharge-unit sliding mechanism 10 after the stoppage is reduced to such a level as not to exert a bad influence on the discharge of droplets.

From the side toward which the substrate-mounting plate 3 relatively moves, the droplet discharge unit 11, which has been moved so as to be above the center line of the defective part 40a, moves relatively in the direction of an arrow D through the uniform motion of the head gantry unit 7, and then discharges droplets through nozzle holes 23 located above the defective part 40a. Since it is possible here to use a plurality of nozzle holes 23 located directly above the defective part 40a, it is possible to increase the speed of uniform motion of the head gantry unit 7, in comparison with the case of use of a single nozzle hole. This makes it possible to improve the speed of processing of the whole substrate.

Next, as shown in (b) of FIG. 18, the droplet discharge unit 11, which has discharged droplets onto the defective parts 40a, moves in the direction of an arrow E through the drive of the discharge-unit sliding mechanism 10, and then stops at such a place that the nozzle holes 23 are aligned with the center line of the defective part 40c, in order to repair the defective part 40c. Since the head gantry unit 7 is now moving to the left on the drawing at a constant speed, the droplet discharge unit 11 moves relatively in the direction of an arrow F of (c) of FIG. 18, and then stops. Then, the movement of the head gantry unit 7 causes the droplet discharge unit 11 to move relatively in the direction of an arrow G. Meanwhile, the droplet discharge unit 11 repairs the defective part 40c by discharging droplets through nozzle holes 23 located directly above the defective part 40c.

Then, after finishing moving in one direction, the head gantry unit 7 starts to move in the other direction. As shown in (d) of FIG. 18, the droplet discharge unit 11 moves in the direction of an arrow K with use of the discharge-unit sliding mechanism 10, and then stops with the nozzle holes 23 aligned with the center line of the defective part 40b, in order to repair the defective part 40b. Then, the movement of the head gantry unit 7 causes the droplet discharge unit 11 to move relatively in the direction of an arrow L, and the droplet discharge unit 11 discharges droplets through the nozzle holes 23 located directly above the defective part 40b.

Thus, the three defective parts 40a, 40c, and 40b are repaired with use of the back-and-forth motion of the head gantry unit 7 in the order named, and this is the optimum use of a constitutional advantage of the present defect repairing apparatus. That is, as shown in (c) of FIG. 18, in discharging droplets onto the defective part 40a through the plurality of nozzle holes 23, the droplet discharge unit 11 cannot be moved until the actually discharging nozzle hole 23 on the extreme right on the drawing is no longer directly above the defective part 40a. At least in a region corresponding to the distance between both ends of the line of nozzle holes 23 being used, the droplet discharge unit 11 cannot move up or down on the drawing to be ready to repair the next defective part.

This range of incapability H contains, in addition to a strip-shaped range starting from an end of the defective part that has just been processed and corresponding to the distance between both ends of the line of nozzle holes 23 being used, a region obtained by multiplying the speed of movement of the conveying stage by the sum of the amount of time required to move in the direction of the arrow E ((b) of FIG. 18) and the amount of time required to still residual vibration after the movement.

As shown in (c) of FIG. 18, the defective part 40b is located in a range of incapability H with respect to the defective part 40a. Therefore, the defective part 40b is not processed immediately after the defective part 40a has been repaired. Instead, the defective part 40c is repaired because it does not belong to the range of incapability H. Then, along with the back-and-forth motion of the head gantry unit 7, the defective part 40b is repaired after the defective part 40c has been repaired, because the defective part 40b does not belong to a range of incapability H with respect to the defective part 40c.

The foregoing has described the moving operation of a single droplet discharge unit 11. However, the defect repairing apparatus has a plurality of droplet discharge units 11 each of which operates independently. The defect repairing apparatus according to the present embodiment is not limited to an apparatus for repairing defects in a color filter substrate, and can discharge droplets onto intended spots scattered about on a substrate.

(a) through (c) of FIG. 19 are schematic plan views showing a case where a droplet discharge unit 11a that drops three types of droplet material performs a discharging operation by moving in a direction orthogonal to longer sides of pixels 42R, 42G, and 42B. (a) through (c) of FIG. 20 are schematic plan views showing a case where a droplet discharge unit 11a that drops three types of droplet material performs a discharging operation by moving in a direction parallel to longer sides of pixels 42R, 42G, and 42B. In cases where there occurs a color mixture of R and G pixels in course of manufacture due to dust or the like and the R and G pixels become unable to show their respective intended colors, those portions are removed by a laser so as to be rectangular in shape and the defect repairing apparatus according to the present embodiment is used to drop droplets onto the rectangular parts.

(a) through (c) of FIG. 19 and (a) through (c) of FIG. 20 show a droplet discharge unit 11 and pixels 42R, 42G, and 42B to be repaired by the droplet discharge unit 11, and assumes that because the pixels 42R and 42G leaked to form a color mixture, the spots of color mixture have been removed in advance by a laser so as to form into depressions.

(a) of FIG. 19 shows a pre-repair state where the droplet discharge unit 11 is moving toward the pixels 42R, 42G, and 42B in the direction of an arrow of the drawing. (b) of FIG. 19 shows the immediate aftermath of the dropping of droplets onto the pixel 42R through nozzle holes 23R. Next, as shown in (c) of FIG. 19, droplets are dropped onto the pixel 42G through nozzle holes 23G.

Also in cases where the longer sides of the pixels 42R, 42G, and 42B are parallel to the directions of movement of the head gantry unit (droplet discharge unit 11a), (a) of FIG. 20 shows a pre-repair state, and the pixels 42R and 42G are repaired in the order of (b) and (c) of FIG. 20.

(Embodiment 2)

(a) of FIG. 21 is a plan view of an arrangement of head gantry units of a defect repairing apparatus according to Embodiment 2, and (b) of FIG. 21 is a plan view for explaining an operation thereof.

The defect repairing apparatus according to Embodiment 2 has two head gantry units 7 provided in parallel with each other with a predetermined distance therebetween. Each of the head gantry units 7 is provided with four droplet discharge units 11. Therefore, the droplet application apparatus is provided with a total of eight droplet discharge units 11.

The four droplet discharge units 11 of the first head gantry unit 7 are slid by discharge-unit sliding mechanisms 11 overlapped in movable region with one another. For this reason, any one of the four droplet discharge units 11 can move to any position on the substrate. The second head gantry unit 7 is similarly provided with four droplet discharge units 11.

Each of the droplet discharge units 11 can move only within a moving range P of its corresponding discharge-unit sliding mechanism 10, and the respective moving ranges of the discharge-unit sliding mechanisms 10 adjacent to one another in a zigzag pattern are partially overlapped along the directions of movement of the droplet discharge units 11. For this reason, any one of the four droplet discharge units 11 on a single gantry unit can move without fail to a position along the longer sides of the head gantry unit 7. The present embodiment has two unit arrays each of which is a set of droplet discharge units 11 capable of complementing one another in moving to all positions along a direction orthogonal to the directions of movement of the head gantry unit 7. Each of the unit arrays is constituted by four droplet discharge units 11.

The target substrate 35 has a plurality of defective parts 40 scattered about thereon, and the plurality of defective parts 40 are represented by black dots in the drawings. The target substrate 35 is equally divided into regions arranged in columns corresponding in number to unit arrays and rows corresponding in number to droplet discharge units of each of the unit arrays. Specifically, the target substrate 35 is divided into regions arranged in four rows and two columns for which the droplet discharge units 11 is respectively responsible. For example, the upper left droplet discharge unit 11 provided on the left head gantry unit 7 repairs only those defective parts 40 scattered about in the region 41 shaded in the drawings. According to the unit array mentioned above in (a) and (b) of FIG. 17, the target substrate 35 is divided into regions arranged in nine rows and one column as shown in (a) and (b) of FIG. 17, because the number of unit arrays is 1.

(b) of FIG. 21 shows a state where the head gantry units 7 have moved forth halfway across the target substrate 35, and the head gantry units 7 finish their forward movements after reaching the positions pointed by the white arrows in the drawing, respectively. After that, the head gantry units 7 shift to backward movements to return to the positions shown in (a) of FIG. 21, respectively. Such a combination of forward and backward movements is defined as a single back-and-forth movement. The defective parts 40 scattered about entirely on the target substrate 35 are repaired by repeating one or more back-and-forth movements in accordance with the number of defective parts 40 scattered about. Due to the difference in the number of defective parts 40 among the regions for which the total of eight droplet discharge units 11 are respectively responsible, there occurs a difference in completion or incompletion among the droplet discharge units 11. However, the head gantry units 7 repeat back-and-froth movements until all the droplet discharge units 11 finish repairing the defective parts 40.

As shown in (b) of FIG. 21, each of the aforementioned unit arrays is a set of four droplet discharge units 11 mounted on a single head gantry unit 7, and these unit arrays has center lines Y2-Y2 and Y3-Y3, respectively. In the present embodiment, the distance between the respective center lines Y2-Y2 and Y3-Y3 of these two unit arrays (head gantry units 7) is substantially ½ of the length of the target substrate 35 along the direction of conveyance. Moreover, as shown in (b) of FIG. 21, the two head gantry units 7 are disposed so that the distance between the center lines Y2-Y2 and Y3-Y3 is substantially half of the width of the target substrate 35, and each of the head gantry units 7 makes movements from side to side by the amount of movement substantially half of the width of the substrate while being centered on its location.

By thus dividing a substrate widthways according to the number of unit arrays and causing the unit arrays to perform scanning within their respective regions into which the substrate has been divided, it becomes possible to efficiently perform a repairing operation. In cases where the number of unit arrays is 1 as shown in (a) and (b) of FIG. 17, the unit array makes movements from one side to another of the substrate while being centered on an intermediate line of the substrate.

FIG. 22 is a plan view of another arrangement of head gantry units of the defect repairing apparatus according to Embodiment 2. FIG. 22 shows an example of an arrangement having three unit arrays (head gantry units 7). In this case, a total of three units arrays are formed with four droplet discharge units 11 mounted for each unit. Therefore, the target substrate 35 is divided into regions arranged in four rows and three columns.

For a defect repairing apparatus having n unit arrays (where n is an integer), it is only necessary to divide a target substrate into n regions and cause the unit arrays to perform scanning more than once by making movements from side to side by the amount of movement 1/n of the width of the substrate while being centered on intermediate lines of the n regions, respectively. This makes it possible to minimize the total distance over which each of the head gantry units 7 makes back-and-forth movements and thereby minimize the amount of time required to process the substrate. This ratio does not need to be strictly applied. Within a margin of error of approximately ±20%, there will be a great time-shortening effect.

The amount of time required to process the substrate can be shorten within a margin of:

$$0.8d \leq D/n \leq 1.2d,$$

where D denotes the width of the target substrate 35 along the directions of movement of head gantry units 7, d denotes the width across which each unit array performs scanning, and n denotes the number of unit arrays.

A processed substrate finished with repair is taken out by a conveyor robot (not shown). In the case of a color filter substrate, the substrate is completed by placing the substrate into a calcining furnace and then solidifying droplet material. Embodiment 2 has described a defect repairing apparatus having two unit arrays and a defect repairing apparatus having three unit arrays. This shows that in the case of n unit arrays, it is only necessary to divide the substrate into n regions with respect to the width D of the substrate along the direction of introduction of the substrate and cause the unit arrays to make movements from side to side with amplitude of D/2n of the substrate while being centered on intermediate lines of the regions, respectively. Further, by making d substantially identical to D/n, it becomes possible to make an attempt to minimize the size of the apparatus. However, in the case of a difference of approximately ±10%, it is possible to reduce the occupied area of the apparatus, without causing a great increase in size of the apparatus. Further, although it is preferable that d and D/n be identical. However, in the case of a difference of up to ±20%, it is possible to shorten takt time, without causing a great increase in the amount of time required for each substrate.

(a) and (b) of FIG. 23 are plan views of still another arrangement of a head gantry unit of the defect repairing apparatus according to Embodiment 2. Provided on a first side surface of the gantry 9 is a discharge-unit sliding mechanism 10 on which a droplet discharge unit 11 has been mounted. Provided on a second side surface of the gantry 9 are discharge-unit sliding mechanisms 10 on which droplet discharge units 11 have been respectively mounted. The first side surface of the gantry 9 is perpendicular to the substrate-mounting plate 3, and the second side surface of the gantry 9 is inclined with respect to the substrate-mounting plate 3.

The droplet discharge unit 11 of the first side surface of the gantry 9 slides in a direction inclined from a direction perpendicular to the directions in which the head gantry unit slides (i.e., to a direction parallel to Direction Y of FIG. 1), and the droplet discharge units 11 of the second side surface of the gantry 9 also slide in a direction inclined from a direction perpendicular to the directions in which the head gantry unit slides (i.e., to a direction parallel to Direction Y of FIG. 1). The present invention can be applied even in such a case where the directions in which a droplet discharge unit slides is not perpendicular to the direction of conveyance of a substrate. Further, even when a plurality of sliding mechanisms slide in different directions with respect to the direction of conveyance, it is possible to grasp the trajectory of each of the sliding mechanisms in advance and correct the timing of discharge of a droplet discharge unit in accordance with the sliding position coordinates.

Although Embodiments 1 and 2 above have described examples of defective pixels having occurred in CF panels, the present invention is not limited to these. The present invention can be applied to manufacture of an electroluminescence (EL) display device having a plurality of discharged parts arranged in a matrix manner or in a stripe manner. Further, the present invention can be applied to manufacture of a back substrate of a plasma display device. Furthermore, the present invention can be applied to manufacture of an image display device including an electron-releasing element and manufacture of a wire.

Further, although the present embodiments have shown an arrangement in which a gantry moves back and forth from side to side repeatedly over a substrate, it is not necessary to necessarily scan the whole substrate through all back-and-forth movements.

Especially in cases where droplet discharge units, capable of moving each independently in a direction different from the direction conveyance of a substrate, which is in the process of moving relatively in the direction of conveyance at a substantially constant velocity with respect to the substrate circulate in sequence to repair a plurality of to-be-repaired spots scattered about on the substrate, it is possible to scan the substrate more than once by making inversion movements repeatedly in the direction of relative movement.

As the substrate is scanned, the number of spots to be repaired becomes smaller. In the final one of the plurality of scanning steps, it is not necessary to scan the whole substrate. Instead, it is only necessary to partially scan the substrate.

In cases where it is known where to repair on the substrate, it is not necessary to scan all the regions on the substrate, because it is possible to predict where the droplet discharge units make repairs while circulating in sequence.

According to the present invention, the movement at a substantially constant velocity in the direction of conveyance encompasses a gently accelerated movement and a gently decelerated movement.

The present invention is not limited to the description of the embodiments above, but may be altered by a skilled person within the scope of the claims. An embodiment based on a proper combination of technical means disclosed in different embodiments is encompassed in the technical scope of the present invention.

It should be noted that each component or each process step of the defect repairing apparatus of the embodiments above can be realized by causing computing means such as a CPU to execute a program stored in storage means such as a ROM (read-only memory) or a RAM and control communication means such as an interface circuit. Therefore, the various functions and various processes of a defect repairing apparatus according to the present embodiment can be realized simply by causing a computer having these means to read a recording medium in which the program has been recorded and execute the program. Further, the various functions and various processes can be realized on any computer by recording the program in a removable recording medium.

The recording medium may be a program medium, such as a ROM, which is a memory (not shown) for executing processing in a microcomputer. Alternatively, the recording medium may be a program medium that can be read by inserting the recording medium into a program reading device (not shown) provided as an external storage device.

In either case, it is preferable that the stored program be arranged so as to be executed by being accessed by a microprocessor. Furthermore, it is preferable that the program be arranged so as to be read and then downloaded to a program storage area where the program is executed. It is assumed that the download program is stored in advance in the main apparatus.

Further, the program medium is a recording medium arranged so as to be separable from the main body. Examples of such a program medium include: a tape, such as a magnetic tape or a cassette tape; a magnetic disk, such as a flexible disk or a hard disk; an optical disk, such as a CD/MO/MD/DVD; a card, such as an IC card (inclusive of a memory card); and a semiconductor memory, such as a mask ROM, an EPROM (erasable programmable read only memory), an EEPROM (electrically erasable programmable read only memory), or a flash ROM. Each of these recording media carries the program in a fixed manner.

Alternatively, in the case of a system configuration to which a communication network such as the Internet can be connected, it is preferable that the program medium be a storage medium carrying the program in such a floating manner that the program is downloaded over the communication network.

Further, in cases where the program is downloaded over a communications network in such a manner, it is preferable that a program for downloading the program be stored in advance in the main apparatus or installed from another recording medium.

Industrial Applicability

The present invention can be applied to a defect repairing apparatus, a defect repairing method, a program, and a computer-readable recording medium for repairing defects in accordance with data indicative of the positions of defects scattered about on a substrate.

The invention claimed is:

1. A defect repairing apparatus comprising:
a substrate-mounting plate for securing a substrate conveyed;
a plurality of droplet discharge units, disposed along a direction different from a direction of conveyance of the substrate as seen from a direction perpendicular to the substrate secured by the substrate-mounting plate, which discharge droplets onto defects scattered about on the substrate;
one or more gantries on which the plurality of droplet discharge units have been mounted;
gantry sliding mechanism for moving the one or more gantries relatively at a constant velocity along the direction of conveyance of the substrate; and
an observation camera unit connected to at least one of the gantries via a camera sliding mechanism in such a manner that the observation camera unit is movable along said at least one of the gantries, the gantry sliding mechanism and the camera sliding mechanism enabling the observation camera unit to output address information indicative of landing positions of droplets on a surface of the substrate, the address information being based on an amount of movement of the gantry sliding mechanism and an amount of movement of the camera sliding mechanism,
the droplet discharge units moving each independently along a direction different from the direction of conveyance in accordance with the address information outputted by the observation camera unit, while the one or more gantries are moving relatively along the direction of conveyance of the substrate.

2. The defect repairing apparatus as set forth in claim 1, wherein the gantry sliding mechanism causes the one or more gantries to move back and forth from one side to another of the substrate.

3. The defect repairing apparatus as set forth in claim 1, wherein the gantries are provided with a predetermined distance therebetween along the direction of conveyance of the substrate.

4. The defect repairing apparatus as set forth in claim 1, wherein the one or more gantries are provided with a plurality of discharge unit sliding mechanisms that cause the respective droplet discharge units to slide along a direction perpendicular to the direction of conveyance.

5. The defect repairing apparatus as set forth in claim 4, wherein the discharge unit sliding mechanisms cause the respective droplet discharge units to slide in sliding ranges whose edges are overlapped with one another as seen from the direction of conveyance.

6. The defect repairing apparatus as set forth in claim 4, wherein the plurality of discharge unit sliding mechanisms are disposed in a zigzag pattern as seen from the direction perpendicular to the substrate.

7. The defect repairing apparatus as set forth in claim 1, wherein the droplet discharge units are assigned to their respective repair regions of the substrate.

8. The defect repairing apparatus as set forth in claim 1, wherein the droplet discharge units discharge the droplets onto the defects in a resting state after having moved along the direction different from the direction of conveyance.

9. The defect repairing apparatus as set forth in claim 1, wherein the droplet discharge units move along the direction different from the direction of conveyance so that the droplet discharge units discharge the droplets in positions identical to positions of the defects on the substrate.

10. The defect repairing apparatus as set forth in claim 1, wherein each of the gantries on which the plurality of droplet discharge units have been mounted has a weight of not less than 0.5 tons to not more than 4 tons.

* * * * *